(12) United States Patent
Saitoh et al.

(10) Patent No.: US 9,349,340 B2
(45) Date of Patent: May 24, 2016

(54) THIN-FILM TRANSISTOR SUBSTRATE, DISPLAY DEVICE PROVIDED WITH SAME, AND METHOD FOR PRODUCING THIN-FILM TRANSISTOR SUBSTRATE

(75) Inventors: Masaki Saitoh, Osaka (JP); Naoki Makita, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 399 days.

(21) Appl. No.: 13/882,938

(22) PCT Filed: Nov. 8, 2011

(86) PCT No.: PCT/JP2011/006226
§ 371 (c)(1),
(2), (4) Date: May 1, 2013

(87) PCT Pub. No.: WO2012/066745
PCT Pub. Date: May 24, 2012

(65) Prior Publication Data
US 2013/0222219 A1 Aug. 29, 2013

(30) Foreign Application Priority Data
Nov. 15, 2010 (JP) ................ 2010-255263

(51) Int. Cl.
*H01L 27/12* (2006.01)
*G09G 3/36* (2006.01)
*H03K 17/06* (2006.01)

(52) U.S. Cl.
CPC ............ *G09G 3/3696* (2013.01); *H01L 27/127* (2013.01); *H01L 27/1222* (2013.01); *H01L 27/1288* (2013.01); *H03K 17/063* (2013.01)

(58) Field of Classification Search
CPC ............... G09G 3/3696; H03K 17/063; H01L 27/1288; H01L 27/1222; H01L 27/127
See application file for complete search history.

(56) References Cited

U.S. PATENT DOCUMENTS

| 2002/0075205 A1* | 6/2002 | Kimura ................ G09G 3/3659 345/55 |
| 2008/0074176 A1* | 3/2008 | Yamamoto ................ G05F 1/56 327/544 |
| 2011/0038201 A1 | 2/2011 | Takahashi et al. |
| 2011/0089495 A1* | 4/2011 | Gluschenkov .. H01L 21/823857 257/369 |

FOREIGN PATENT DOCUMENTS

| JP | 2002-229532 A | 8/2002 |
| JP | 2008-118047 A | 5/2008 |

OTHER PUBLICATIONS

Zabeli et al. "The threshold voltage of MOSFET and its influence on digital circuits". Recent Advances in Systems, Communications & Computers. WSEAS Press. pp. 266-271. Apr. 2008.*

* cited by examiner

*Primary Examiner* — Viet Pham
(74) *Attorney, Agent, or Firm* — Chen Yoshimura LLP

(57) ABSTRACT

In at least one operation control TFT (27N, 27P) in a control circuit (27), an impurity of a type that generates an impurity level of a channel region (33c) is included in the channel region (33c) as a threshold adjustment impurity, and the concentration of the threshold adjustment impurity is made higher than the concentration of the threshold adjustment impurity in channel regions (33c) of other TFTs (21, 25, 28) of the same type, thus causing the absolute value of the threshold voltage to be greater than that of the other TFTs (21, 25, 28) of the same type.

7 Claims, 25 Drawing Sheets

(a)

n-type TFT not in Inverter Circuit (b)

n-type TFT in Inverter Circuit (c)

p-type TFT not in Inverter Circuit (d)

p-type TFT in Inverter Circuit (a)

n-type TFT not in Inverter Circuit (b)

n-type TFT in Inverter Circuit (c)

p-type TFT not in Inverter Circuit (d)

p-type TFT in Inverter Circuit

THIN-FILM TRANSISTOR SUBSTRATE, DISPLAY DEVICE PROVIDED WITH SAME, AND METHOD FOR PRODUCING THIN-FILM TRANSISTOR SUBSTRATE

TECHNICAL FIELD

The present invention relates to a thin film transistor (referred to as TFT below) substrate, a display device provided with the same, and a method for manufacturing a TFT substrate. More particularly, the present invention relates to a countermeasure against erroneous operations of an element in a memory circuit in binary memory display.

BACKGROUND ART

Conventionally, liquid crystal display devices that are provided with a memory circuit for each pixel, which is the smallest unit of an image, and that perform binary memory display, in addition to a normal full color display in which still images and videos are displayed in multiple gradations, have been known (see Patent Document 1, for example). In the binary memory display, a data potential written in the pixel is maintained by the memory circuit, and still images are displayed by performing a refresh operation while reversing the polarity of the data potential.

In such a liquid crystal display device, during the period of the binary memory display, the data potential stored in the memory circuit is used, and therefore, it is not necessary to supply new data potential to each pixel. Because this allows all of peripheral driver circuits, except for an AC driver circuit performing the refresh operation, to be stopped, power consumption can be reduced. Therefore, this liquid crystal display device can be suitably used as a display device for performing image display in which a reduction in power consumption is strongly demanded such as standby screen display in mobile phones.

Each pixel of the above-mentioned liquid crystal display device that can perform binary memory display includes: a drive control TFT connected to a gate wiring line and a source wiring line; a pixel potential capacitance element and a pixel electrode connected to the drive control TFT; and the memory circuit described above. The memory circuit is provided with: an input control TFT that controls an input of a binary logic level, which is high (active level) or low (non-active level); a memory capacitance element that stores the binary logic level inputted through the input control TFT; an inverter circuit as a control circuit that determines a binary logic level to be outputted to the outside based on the binary logic level stored in the memory capacitance element; and an output control TFT that controls an output of a binary logic level with the polarity reversed by the inverter circuit, to the pixel potential capacitance element and the pixel electrode. The inverter circuit is constituted of an n-type TFT and a p-type TFT each having the gate connected to the memory capacitance element. The source of the n-type TFT is applied with a low potential, and the source of the p-type TFT is applied with a high potential. The drains of these n-type TFT and p-type TFT are integrally formed with each other and connected to the source of the output control TFT. The drive control TFT, the input control TFT, the n-type TFT and p-type TFT of the inverter circuit, and the output control TFT are all formed on a base substrate having an insulating property such as a glass substrate.

When the liquid crystal display device configured in the manner described above performs the binary memory display, first, a data potential of a binary logic level (high, for example) is written into the pixel potential capacitance element and the pixel electrode. Next, the input control TFT is turned on, and the data potential of the pixel potential capacitance element is inputted and stored in the memory capacitance element. The potential of the binary logic level stored in the memory capacitance element is converted into a reverse potential (low, for example) with the polarity reversed by the inverter circuit as a result of one TFT (n-type TFT, for example) of the inverter circuit being turned on and the other TFT (p-type TFT, for example) being turned off, based on the potential. Then, the output control TFT is turned on such that the reverse potential is inputted and stored in the pixel potential capacitance element and the pixel electrode. This way, the potential of the pixel potential capacitance element and the pixel electrode is refreshed to the reverse potential. By repeating such a refresh operation, a still image can be displayed while preventing the degradation of the data potential in the pixel potential capacitance element and the pixel electrode.

RELATED ART DOCUMENT

Patent Document

Patent Document 1: Japanese Patent Application Laid-Open Publication No. 2002-229532

SUMMARY OF THE INVENTION

Problems to be Solved by the Invention

However, in the above-mentioned liquid crystal display device that can perform the binary memory display, when the potential of the pixel potential capacitance element and the pixel electrode is refreshed during the refresh operation, if the potential of the pixel potential capacitance element is low, the potential of the memory capacitance element is high, or conversely, if the potential of the pixel potential capacitance element is high, the potential of the memory capacitance element is low. As a result, it is not possible to prevent an off leak current from being generated in the input control TFT that is turned off, and due to the off leak current, the potential of the memory capacitance element gradually changes over time. In some cases, this potential change turns on a TFT in the inverter circuit that should stay off in the normal operation, which is the p-type TFT if the potential of the memory capacitance element was high before the potential change, or the n-type TFT if the potential of the memory capacitance element was low before the potential change. This can cause a penetrating current to flow between the respective source electrodes of the two TFTs. As a result, an erroneous operation of the inverter circuit occurs, leading to the degradation of display quality in the binary memory display.

However, when the absolute value of the threshold voltage of each of the TFTs constituting the inverter circuit is increased so as to prevent the erroneous operation, the absolute values of the threshold voltages of other TFTs that are formed together with the TFTs in the inverter circuit such as the drive control TFT, the input control TFT, and the output control TFT would also be increased. As a result, although the erroneous operation in the inverter circuit can be prevented, an erroneous operation possibly occurs in other TFTs.

The present invention was made in view of the above-mentioned problems, and an object thereof is to prevent erroneous operations in a control circuit that controls the refresh operation and in other TFTs and to perform the normal binary memory display reliably.

Means for Solving the Problems

In order to achieve the above-mentioned object, in the present invention, the impurity concentrations in channel regions of semiconductor layers are adjusted such that the absolute value of the threshold voltage of a TFT that constitutes a control circuit is greater than the absolute value of the threshold voltage of other TFTs of the same type.

Specifically, the present invention was made to provide the following solutions to a TFT substrate, a display device provided with the same, and a manufacturing method for a TFT substrate, the TFT substrate including: a first input control TFT that controls an input of a binary logic level from an exterior; a first capacitance element that stores the binary logic level inputted through the first input control TFT; a control circuit that has at least one operation control TFT that is turned on and off based on the binary logic level stored in the first capacitance element, the control circuit determining a binary logic level to be outputted to outside based on a state of the operation control TFT; and an output control TFT that controls an output of the binary logic level determined by the control circuit to outside, wherein each of the first input control TFT, the output control TFT, and the operation control TFT is constituted of an n-type TFT or a p-type TFT, each of which includes: a semiconductor layer having a channel region between a pair of high concentration impurity regions disposed separately from each other; a gate insulating film that covers the semiconductor layer; a gate electrode that is disposed on the gate insulating film so as to overlap the channel region; an interlayer insulating film that covers the gate electrode and a portion of the gate insulating film on the semiconductor layer; and a source electrode and a drain electrode disposed on the interlayer insulating film so as to be separated from each other, the source electrode and the drain electrode being respectively connected to the high concentration impurity regions different from each other through contact holes formed in the gate insulating film and the interlayer insulating film.

That is, the first invention provides a TFT substrate wherein at least one of the at least one operation control TFT includes, in the channel region, a threshold adjustment impurity that is an impurity of a type that generates an impurity level in the channel region (an impurity of a type that is the same type as that of the channel region), and a concentration of the threshold adjustment impurity is made higher than a concentration of the threshold adjustment impurity in channel regions of other TFTs of the same type, such that an absolute value of a threshold voltage thereof is made larger than that of other TFTs of the same type.

In the present specification, the "impurity of a type that generates an impurity level in the channel region" is an n-type impurity when the channel region has a donor level, or a p-type impurity when the channel region has an acceptor level.

According to the first invention, in at least one operation control TFT that controls the operation of the control circuit, the concentration of the threshold adjustment impurity in the channel region thereof is higher than the concentration of the threshold adjustment impurity in channel regions of other TFTs of the same type. In the first invention, the threshold adjustment impurity is an impurity of a type that generates an impurity level in the channel region of the operation control TFT, and therefore, the higher the concentration of the threshold adjustment impurity in the channel region is, the greater the absolute value of the threshold voltage in the operation control TFT and other TFTs of the same type becomes. Due to the difference in concentration of the threshold adjustment impurity, the absolute value of the threshold voltage of the operation control TFT is made greater than the absolute value of the threshold voltage of other TFTs of the same type. Therefore, in the control circuit, the operation control TFT with the absolute value of the threshold voltage being greater than that of other TFTs of the same type is unlikely to be turned on when it needs to stay off, even if the potential of the first capacitance element changes due to the off leak current generated in the first input control TFT. This makes it possible to prevent an erroneous operation of the control circuit. Also, because the threshold voltages of the operation control TFT and other TFTs of the same type are separately controlled by making the concentrations of the threshold adjustment impurity differ from each other, it is also possible to prevent an erroneous operation of the other TFTs of the same type even though the absolute value of the threshold voltage of the operation control TFT is increased. As a result, erroneous operations in the control circuit that controls the refresh operation and in other TFTs can be prevented, and it is possible to perform a normal binary memory display reliably.

The second invention provides a TFT substrate, wherein the at least one operation control TFT includes, in the channel region, a threshold adjustment impurity that is an impurity of a type that generates an impurity level having an opposite polarity to an impurity level in the channel region (an impurity of a type that is opposite to the type of the channel region), and a concentration of the threshold adjustment impurity is made lower than a concentration of the threshold adjustment impurity in channel regions of other TFTs of the same type, such that an absolute value of a threshold voltage thereof is made greater than that of other TFTs of the same type.

In the present specification, the "impurity level having an opposite polarity to an impurity level in the channel region" is a donor level when the "impurity level in the channel region" is an acceptor level, or an acceptor level when the "impurity level in the channel region" is a donor level.

According to the second invention, in the at least one operation control TFT that controls the operation of the control circuit, the concentration of the threshold adjustment impurity in the channel region is lower than the concentration of the threshold adjustment impurity in channel regions of other TFTs of the same type. In the second invention, the threshold adjustment impurity is an impurity of a type that generates an impurity level having an opposite polarity to the impurity level in the channel region of the operation control TFT, and therefore, the lower the concentration of the threshold adjustment impurity in the channel region is, the greater the absolute value of the threshold voltage in the operation control TFT and the other TFTs of the same type becomes. Due to the difference in concentration of the threshold adjustment impurity, the absolute value of the threshold voltage of the operation control TFT is made greater than the absolute value of the threshold voltage of other TFTs of the same type. Therefore, in the control circuit, the operation control TFT with the absolute value of the threshold voltage being greater than those of other TFTs of the same type is unlikely to be turned on when it needs to stay off, even if the potential of the first capacitance element changes due to the off leak current generated in the first input control TFT. This makes it possible to prevent an erroneous operation of the control circuit. Also, because the threshold voltages of the operation control TFT and other TFTs of the same type are separately controlled by making the concentrations of the threshold adjustment impurity differ from each other, it is also possible to prevent an erroneous operation of the other TFTs of the same type even though the absolute value of the threshold voltage of the operation control TFT is increased. As a result, erroneous operations in the control circuit that controls the refresh operation and in other TFTs can be prevented, and it is possible to perform a normal binary memory display reliably.

In the third invention, the control circuit in the TFT substrate of the first or second invention is an inverter circuit that has the n-type TFT and p-type TFT as the operation control TFTs.

According to the third invention, the control circuit can be constituted of two TFTs, and therefore, it is possible to reduce the number of elements constituting the control circuit as compared to a typical control circuit constituted of an SRAM (static random access memory) including five TFTs and the like. As a result, the arrangement area of the control circuit can be made smaller, and therefore, it is possible to achieve high-resolution pixels having configurations of the present invention.

The fourth invention provides a TFT substrate, wherein the control circuit has the n-type TFT and p-type TFT as the operation control TFTs, wherein the n-type TFT and p-type TFT as the operation control TFTs include, in the respective channel regions, a threshold adjustment impurity that is an impurity of a type that generates an impurity level in the channel region (an impurity of a type that is the same type as that of the channel region) of one of the TFTs, wherein a concentration of the threshold adjustment impurity in the channel region of the one of the TFTs is made higher than that of the threshold adjustment impurity in channel regions of other TFTs of the same type, and a concentration of the threshold adjustment impurity in the channel region of the other of the TFTs is made lower than that of the threshold adjustment impurity in channel regions of other TFTs of the same type, such that absolute values of threshold voltages of both of the TFTs are greater than those of other TFTs of the respective same types.

According to the fourth invention, in the n-type TFT and the p-type TFT as the operation control TFTs that control the operation of the control circuit, the concentration of the threshold adjustment impurity in the channel region of one of the TFTs is higher than the concentration of the threshold adjustment impurity in channel regions of other TFTs of the same type, and the concentration of the threshold adjustment impurity in the channel region of the other of the TFTs is lower than the concentration of the threshold adjustment impurity in channel regions of other TFTs of the same type. In the fourth invention, the threshold adjustment impurity is an impurity of a type that generates an impurity level in the channel region of one of the n-type TFT and the p-type TFT, and therefore, in the one of the TFTs, the higher the concentration of the threshold adjustment impurity in the channel region is, and in the other of the TFTs, the lower the concentration of the threshold adjustment impurity in the channel region is, the greater the absolute values of the threshold voltages become. Due to the difference in concentration of the threshold adjustment impurity, the absolute values of the threshold voltages of both of the n-type TFT and the p-type TFT as the operation control TFTs are made greater than the absolute values of the threshold voltages of other TFTs of the respective same types. Therefore, the two TFTs as the operation control TFTs are unlikely to be turned on when they need to stay off, even if the potential of the first capacitance element changes due to the off leak current generated in the first input control TFT. This makes it possible to reliably prevent an erroneous operation of the control circuit. Also, because the threshold voltages of the n-type TFT and the p-type TFT as the operation control TFTs and other TFTs of the same types are separately controlled by making the concentrations of the threshold adjustment impurity differ from each other, it is also possible to prevent an erroneous operation of the other TFTs even though the absolute value of the threshold voltage of each of the n-type TFT and p-type TFT that constitute the control circuit is increased. As a result, erroneous operations in the control circuit that controls the refresh operation and in other TFTs can be prevented, and a normal binary memory display can be reliably performed.

The fifth invention is any one of the TFT substrates of the first to fourth inventions, further including: a second input control TFT that controls an input of an analog potential or a binary logic level from outside; a pixel electrode that receives a binary logic level inputted through the second input control TFT; and a second capacitance element that stores a binary logic level inputted through the second input control TFT, wherein the first input control TFT controls an input of the binary logic level inputted through the second input control TFT, and wherein the output control TFT controls an output of a binary logic level determined by the control circuit to the pixel electrode and the second capacitance element.

According to the fifth invention, a pixel configuration that can perform both multi-gradation display by an analog potential and two-gradation display by a binary logic level is specifically realized.

The sixth invention is any one of the TFT substrates of the first to fifth inventions, wherein one of the first input control TFT and the output control TFT is an n-type TFT and the other is a p-type TFT, and wherein gate electrodes of the two TFTs are connected to a common wiring line.

According to the sixth invention, the gate electrodes of the input control TFT and the output control TFT are connected to a common wiring line. Therefore, it is possible to reduce the number of wiring lines as compared with the case in which the respective gate electrodes of the two TFTs are connected to different wiring lines and separately controlled. This makes it possible to achieve a pixel having a high aperture ratio.

The seventh invention is a display device provided with any one of the TFT substrates of the first to sixth inventions.

According to the seventh invention, because the TFT substrates of the first to sixth inventions have excellent characteristics that erroneous operations in the control circuit that controls the refresh operation and in other TFTs can be prevented and the normal binary memory display can be reliably performed, it is possible to achieve a reduction in power consumption without causing degradation of the display quality.

The eighth invention provides a display device that includes the TFT substrate of the fifth invention, wherein the display device has a first display scheme for conducting multi-gradation display in which the first input control TFT is turned off, and an analog potential is inputted to the pixel electrode and the second capacitance element through the second input control TFT; and a second display scheme for conducting two-gradation display that uses less power than the first display scheme, in which a binary logic level is inputted to the first capacitance element through the first input control TFT and the second input control TFT, and a binary logic level determined by the control circuit is inputted to the pixel electrode and the second capacitance element.

According to the eighth invention, when colorful image display is required, the multi-gradation display is conducted by the first display scheme, and when only still image display such as simple text information is required, the two-gradation display is conducted by the second display scheme. This way, by switching between the first display scheme and the second display scheme appropriately for the situation, it is possible to perform necessary image display while keeping power consumption low.

The ninth invention provides a manufacturing method for the TFT substrate of the first invention, including: conducting a semiconductor layer forming process of forming a semiconductor film on a base substrate and patterning the semiconductor film to form the respective semiconductor layers; conducting a gate insulating film forming process of forming a gate insulating film so as to cover the respective semiconductor layers; conducting a first impurity doping process of doping semiconductor layers of at least one of the n-type TFTs and the p-type TFTs, out of a plurality of semiconductor layers covered by the gate insulating film, with a threshold adjustment impurity that is an impurity of a type that generates an impurity level of a channel region (an impurity of a type that is the same type as that of the channel region) of the one type of TFTs; conducting, after the first impurity doping process, a gate electrode forming process of forming the respective gate electrodes on the gate insulating film so as to overlap regions of the respective semiconductor layers where channel regions are to be formed; conducting a second impurity doping process of doping an n-type impurity to semiconductor layers of the n-type TFTs and a p-type impurity to semiconductor layers of the p-type TFTs, respectively, out of the plurality of semiconductor layers, using the respective gate electrodes as masks, to form the pair of high concentration impurity regions and a channel region in each of the semiconductor layers; conducting, after the second impurity doping process, an interlayer insulating film forming process of forming the interlayer insulating film so as to cover the respective gate electrodes and the gate insulating film; conducting a contact hole forming process of patterning the interlayer insulating film and the gate insulating film to form the respective contact holes in the two insulating films so as to respectively reach a pair of high concentration impurity regions of each of the semiconductor layers; and conducting a source/drain electrode forming process of forming a conductive film on the interlayer insulating film having the contact holes formed therein and patterning the conductive film, to form the respective source electrodes and the respective drain electrodes, wherein, in the first impurity doping process, the threshold adjustment impurity is doped to a semiconductor layer of the at least one operation control TFT with a greater amount than that in semiconductor layers of other TFTs of the same type, or the threshold adjustment impurity is doped only into the semiconductor layer of the at least one operation control TFT.

According to the ninth invention, in the first impurity doping process, the threshold adjustment impurity is doped to the semiconductor layer of the at least one operation control TFT that controls the operation of the control circuit with a greater amount than that in semiconductor layers of other TFTs of the same type, or the threshold adjustment impurity is doped only to the semiconductor layer of the at least one operation control TFT. As a result, in the at least one operation control TFT, the concentration of the threshold adjustment impurity in the channel region is made higher than the concentration of the threshold adjustment impurity in channel regions of other TFTs of the same type. In the ninth invention, the threshold adjustment impurity is an impurity of a type that generates an impurity level in the channel region of the at least one operation control TFT, and therefore, the absolute value of the threshold voltage of the operation control TFT is made greater than that of other TFTs of the same type. As a result, it is possible to achieve the TFT substrate of the first invention that has excellent characteristics that an erroneous operation in the control circuit that controls the refresh operation and in other TFTs can be prevented, and the normal binary memory display can be reliably performed.

The tenth invention is the manufacturing method for a TFT substrate of the ninth invention, wherein the first impurity doping process includes: a same type layer doping step of forming a resist pattern for same type layer doping on the gate insulating film in regions overlapping semiconductor layers of one of the n-type TFTs and the p-type TFTs, out of the plurality of semiconductor layers, and doping the threshold adjustment impurity to semiconductor layers of the other of the n-type TFTs and the p-type TFTs using the resist pattern for same type layer doping as a mask; and an adjustment doping step of forming a resist pattern for adjustment doping on the gate insulating film in regions overlapping semiconductor layers except for a specific semiconductor layer of the at least one operation control TFT, out of the plurality of semiconductor layers, and doping the threshold adjustment impurity to the specific semiconductor layer using the resist pattern for adjustment doping as a mask, wherein, in the same layer doping step and the adjustment doping step, the threshold adjustment impurity is doped into respective semiconductor layers of TFTs of the same type.

According to the tenth invention, in the same type layer doping step, the threshold adjustment impurity is doped into semiconductor layers of the n-type TFTs or the p-type TFTs, and in the adjustment doping step, the threshold adjustment impurity is doped into only a semiconductor layer of the at least one operation control TFT. In the same type layer doping step and the adjustment doping step, the threshold adjustment impurity is doped into semiconductor layers of TFTs of the same type, which makes the semiconductor layer of the at least one operation control TFT undergo more threshold adjustment impurity doping steps than semiconductor layers of other TFTs of the same type. Therefore, by conducting the same type layer doping step and the adjustment doping step, the semiconductor layer of the at least one operation control TFT can be reliably doped with a greater amount of the threshold adjustment impurity than semiconductor layers of other TFTs of the same type.

The eleventh invention is the manufacturing method for a TFT substrate of the tenth invention, wherein, in the adjustment doping step, the resist pattern for adjustment doping is formed by using a multi-tone mask such that regions thereof that overlap semiconductor layers of TFTs of a different type from an operation control TFT that includes the specific semiconductor layer are made thicker than other portions, and wherein, in the same type layer doping step, the resist pattern for same type layer doping is formed by thinning the resist pattern for adjustment doping such that the resist pattern is left only in regions that overlap semiconductor layers of TFTs of a different type from the operation control TFT that includes the specific semiconductor layer.

According to the eleventh invention, the resist pattern for adjustment doping is formed by using a multi-tone mask, and the resist pattern for same type layer doping is formed by thinning the resist pattern for adjustment doping, and therefore, two different resist patterns can be made using a single photomask. That is, the resist pattern for adjustment doping and the resist pattern for same type layer doping can be made using a single multi-tone mask, which makes it possible to reduce the number of photomasks.

The twelfth invention provides a manufacturing method for the TFT substrate of the second invention, including: conducting a semiconductor layer forming process of forming a semiconductor film on a base substrate and patterning the semiconductor film to form the respective semiconductor layers; conducting a gate insulating film forming process of forming a gate insulating film so as to cover the respective semiconductor layers; conducting a first impurity doping process of doping semiconductor layers of the n-type TFTs or the p-type TFTs, out of a plurality of semiconductor layers covered by the gate insulating film, with a threshold adjustment impurity that is an impurity of a type that generates an impurity level having an opposite polarity to an impurity level of the channel region (an impurity of a type that is opposite to the type of the channel region) of the one type of TFTs; conducting, after the first impurity doping process, a gate electrode forming process of forming the respective gate electrodes on the gate insulating film so as to overlap the respective semiconductor layers; conducting a second impurity doping process of doping an n-type impurity into semiconductor layers of the n-type TFTs and a p-type impurity into semiconductor layers of the p-type TFTs, respectively, out of the plurality of semiconductor layers, using the respective gate electrodes as masks, to form the pair of high concentration impurity regions and a channel region in each of the semiconductor layers; conducting, after the second impurity doping process, an interlayer insulating film forming process of forming the interlayer insulating film so as to cover the respective gate electrodes and the gate insulating film; conducting a contact hole forming process of patterning the interlayer insulating film and the gate insulating film to form the respective contact holes in the two insulating films so as to respectively reach the pair of high concentration impurity regions of each of the semiconductor layers; and conducting a source/drain electrode forming process of forming a conductive film on the interlayer insulating film having the contact holes formed therein and patterning the conductive film, to form the respective source electrodes and the respective drain electrodes, wherein, in the first impurity doping process, the threshold adjustment impurity is doped to a semiconductor layer of the at least one operation control TFT with a smaller amount than that in semiconductor layers of other TFTs of the same type, or the threshold adjustment impurity is not doped therein at all.

According to the twelfth invention, in the first impurity doping process, the threshold adjustment impurity is doped to a semiconductor layer of the at least one operation control TFT that controls the operation of the control circuit with a smaller amount than that in semiconductor layers of other TFTs of the same type, or no threshold adjustment impurity is doped therein. As a result, in the at least one operation control TFT, the concentration of the threshold adjustment impurity in the channel region is made lower than the concentration of the threshold adjustment impurity in channel regions of other TFTs of the same type. In the twelfth invention, the threshold adjustment impurity is an impurity of a type that generates an impurity level having an opposite polarity to an impurity level in the channel region of the at least one operation control TFT, and therefore, the absolute value of the threshold voltage of the operation control TFT is made greater than that of other TFTs of the same type. As a result, it is possible to achieve the TFT substrate of the second invention that has excellent characteristics that an erroneous operation in the control circuit that controls the refresh operation and in other TFTs can be prevented, and the normal binary memory display can be reliably performed.

The thirteenth invention is the manufacturing method for a TFT substrate of the twelfth invention, wherein the first impurity doping process includes: an adjustment doping step of forming a resist pattern for adjustment doping on the gate insulating film in a region overlapping a specific semiconductor layer of the at least one operation control TFT, out of the plurality of semiconductor layers, and doping the threshold adjustment impurity into semiconductor layers except for the specific semiconductor layer using the resist pattern for adjustment doping as a mask; and a same type layer doping step of forming a resist pattern for same type layer doping on the gate insulating film in regions overlapping semiconductor layers of one of the n-type TFTs and the p-type TFTs, out of the plurality of semiconductor layers, and doping the threshold adjustment impurity into semiconductor layers of the other of the n-type TFTs and the p-type TFTs using the resist pattern for same type layer doping as a mask, and wherein, in the adjustment doping step and the same type layer doping step, the threshold adjustment impurity is not doped into semiconductor layers of TFTs of the same type.

According to the thirteenth invention, in the adjustment doping step, the threshold adjustment impurity is doped to semiconductor layers except for the specific semiconductor layer of the at least one operation control TFT, and in the same type layer doping step, the threshold adjustment impurity is doped into semiconductor layers of the n-type TFTs or the p-type TFTs. In the adjustment doping step and the same type layer doping step, the threshold adjustment impurity is not doped to semiconductor layers of TFTs of the same type, which makes the semiconductor layer of the at least one operation control TFT undergo less threshold adjustment impurity doping steps than semiconductor layers of other TFTs of the same type. As a result, by conducting the adjustment doping step and the same type layer doping step, it is possible to ensure that the semiconductor layer of the at least one operation control TFT is doped with a smaller amount of the threshold adjustment impurity than semiconductor layers of other TFTs of the same type, or is not doped with the threshold adjustment impurity at all.

The fourteenth invention is the manufacturing method for a TFT substrate according to the thirteenth invention, wherein, in the same type layer doping step, the resist pattern for same type layer doping is formed by using a multi-tone mask such that a portion thereof overlapping the specific semiconductor layer is made thicker than other portions, and wherein, in the adjustment doping step, the resist pattern for adjustment doping is formed by thinning the resist pattern for same type layer doping such that the resist pattern is left only in a region that overlaps the specific semiconductor layer.

According to the fourteenth invention, the resist pattern for same type layer doping is formed by using a multi-tone mask, and the resist pattern for adjustment doping is formed by thinning the resist pattern for same type layer doping. Therefore, the resist pattern for same type layer doping and the resist pattern for adjustment doping can be made using a single multi-tone mask, which makes it possible to reduce the number of photomasks.

The fifteenth invention provides a manufacturing method for the TFT substrate of the fourth invention, including: conducting a semiconductor layer forming process of forming a semiconductor film on a base substrate and patterning the semiconductor film to form the respective semiconductor layers having the same impurity level as each other; conducting a gate insulating film forming process of forming a gate insulating film so as to cover the respective semiconductor layers; conducting a first impurity doping process of doping a plurality of semiconductor layers covered by the gate insulating film with a threshold adjustment impurity that is an impurity of a type that generates an impurity level having an opposite polarity to the impurity level of the respective semiconductor layers (an impurity of a type that is an opposite to the type of the respective semiconductor layers); conducting, after the first impurity doping process, a gate electrode forming process of forming the respective gate electrodes on the gate insulating film so as to overlap the respective semiconductor layers; conducting a second impurity doping process of doping an n-type impurity to semiconductor layers of the n-type TFTs and a p-type impurity into semiconductor layer of the p-type TFTs, respectively, out of the plurality of semiconductor layers, using the respective gate electrodes as masks, to form the pair of high concentration impurity regions and a channel region in each of the semiconductor layers; conducting, after the second impurity doping process, an interlayer insulating film forming process of forming the interlayer insulating film so as to cover the respective gate electrodes and the gate insulating film; conducting a contact hole forming process of patterning the interlayer insulating film and the gate insulating film to form the respective contact holes in the two insulating films so as to respectively reach a pair of high concentration impurity regions of each of the semiconductor layers; and conducting a source/drain electrode forming process of forming a conductive film on the interlayer insulating film having the contact holes formed therein and patterning the conductive film, to form the respective source electrodes and the respective drain electrodes, wherein, in the first impurity doping process, the threshold adjustment impurity is doped into a semiconductor layer of one of the n-type TFT and the p-type TFT as the operation control TFTs with a greater amount than semiconductor layers of other TFTs of the same type such that the semiconductor layer and semiconductor layers of other TFTs of the same type are set to have impurity levels respectively corresponding to amounts of the threshold adjustment impurity, and the threshold adjustment impurity is doped into a semiconductor layer of the other of the n-type TFT and the p-type TFT as the operation control TFTs with a smaller amount than semiconductor layers of other TFTs of the same type, or the threshold adjustment impurity is not doped therein at all such that the semiconductor layer and semiconductor layers of other TFTs of the same type maintain an as-formed impurity level.

According to the fifteenth invention, in the first impurity doping process, a semiconductor layer of one of the n-type TFT and the p-type TFT as the operation control TFTs that control the operation of the control circuit is doped with a greater amount of the threshold adjustment impurity, which is an impurity of a type that generates an impurity level in the channel regions of the TFT, than semiconductor layers of other TFTs of the same type. Therefore, the semiconductor layer and semiconductor layers of other TFTs of the same type have impurity levels respectively corresponding to the amounts of the threshold adjustment impurity. Also, in this process, a semiconductor layer of the other of the n-type TFT and the p-type TFT as the operation control TFTs is doped with a smaller amount of the threshold adjustment impurity than semiconductor layers of other TFTs of the same type, or with no threshold adjustment impurity, such that the semiconductor layer and semiconductor layers of other TFTs of the same type maintain an as-formed impurity level. As a result, in one of the n-type TFT and the p-type TFT as the operation control TFTs, the concentration of the threshold adjustment impurity in the channel region is made higher than the concentration of the threshold adjustment impurity in channel regions of other TFTs of the same type, and in the other of the n-type TFT and the p-type TFT as the operation control TFTs, the concentration of the threshold adjustment impurity in the channel region is made lower than the concentration of the threshold adjustment impurity in channel regions of other TFTs of the same type. Therefore, the absolute values of the threshold voltages of both of the n-type TFT and the p-type TFT as the operation control TFTs are made greater than the absolute values of the threshold voltages of other TFTs of the respective same types. As a result, it is possible to achieve the TFT substrate of the fourth invention that has excellent characteristics that an erroneous operation in the control circuit that controls the refresh operation and in other TFTs can be prevented, and the normal binary memory display can be reliably performed.

Effects of the Invention

According to the present invention, in at least one of the operation control TFTs constituting the control circuit and other TFTs of the same type, the absolute value of the threshold voltage of the operation control TFT is made greater than the absolute value of the threshold voltage of other TFTs of the same type by adjusting the concentrations of a threshold adjustment impurity in channel regions of the semiconductor layers. Therefore, it is possible to prevent an erroneous operation in the control circuit that controls the refresh operation and in other TFTs, and to conduct the normal binary memory display reliably. As a result, a reduction in power consumption can be achieved without causing degradation of the display quality.

BRIEF DESCRIPTION OF THE DRAWINGS

FIG. 9(a) shows characteristics of n-type TFTs except for an n-type TFT in an inverter circuit. FIG. 9(b) shows characteristics of the n-type TFT in the inverter circuit. FIG. 9(c) shows characteristics of p-type TFTs except for a p-type TFT in the inverter circuit. FIG. 9(d) shows characteristics of the p-type TFT in the inverter circuit.

FIG. 13(a) shows an all layer doping step; FIG. 13(b) shows a same type layer doping step; and FIG. 13(c) shows an adjustment doping step.

FIG. 15(a) shows a step of doping an impurity into semiconductor layers of p-type TFTs, and FIG. 15(b) shows a step of doping an impurity into semiconductor layers of n-type TFTs.

FIG. 16(a) shows the substrate after the first interlayer insulating film forming process, and FIG. 16(b) shows the substrate after the contact hole forming process.

FIG. 19(a) shows a specific layer doping step; and FIG. 19(b) shows a same type layer doping step.

FIG. 20(a) shows characteristics of n-type TFTs except for an n-type TFT in an inverter circuit. FIG. 20(b) shows characteristics of the n-type TFT in the inverter circuit. FIG. 20(c) shows characteristics of p-type TFTs except for a p-type TFT in the inverter circuit. FIG. 20(d) shows characteristics of the p-type TFT in the inverter circuit.

FIG. 21(a) shows an adjustment doping step; and FIG. 21(b) shows a same type layer doping step.

FIG. 22(a) shows a same type layer doping step; and FIG. 22(b) shows an adjustment doping step.

FIG. 23(a) shows characteristics of n-type TFTs except for an n-type TFT in an inverter circuit. FIG. 23(b) shows characteristics of the n-type TFT in the inverter circuit. FIG. 23(c) shows characteristics of p-type TFTs except for a p-type TFT in the inverter circuit. FIG. 23(d) shows characteristics of the p-type TFT in the inverter circuit.

FIG. 24(a) shows a same type layer doping step; and FIG. 24(b) shows an adjustment doping step.

DETAILED DESCRIPTION OF EMBODIMENTS

Embodiments of the present invention will be described in detail below with reference to drawings. The present invention is not limited to the embodiments below.

Embodiment 1

Figure 1:
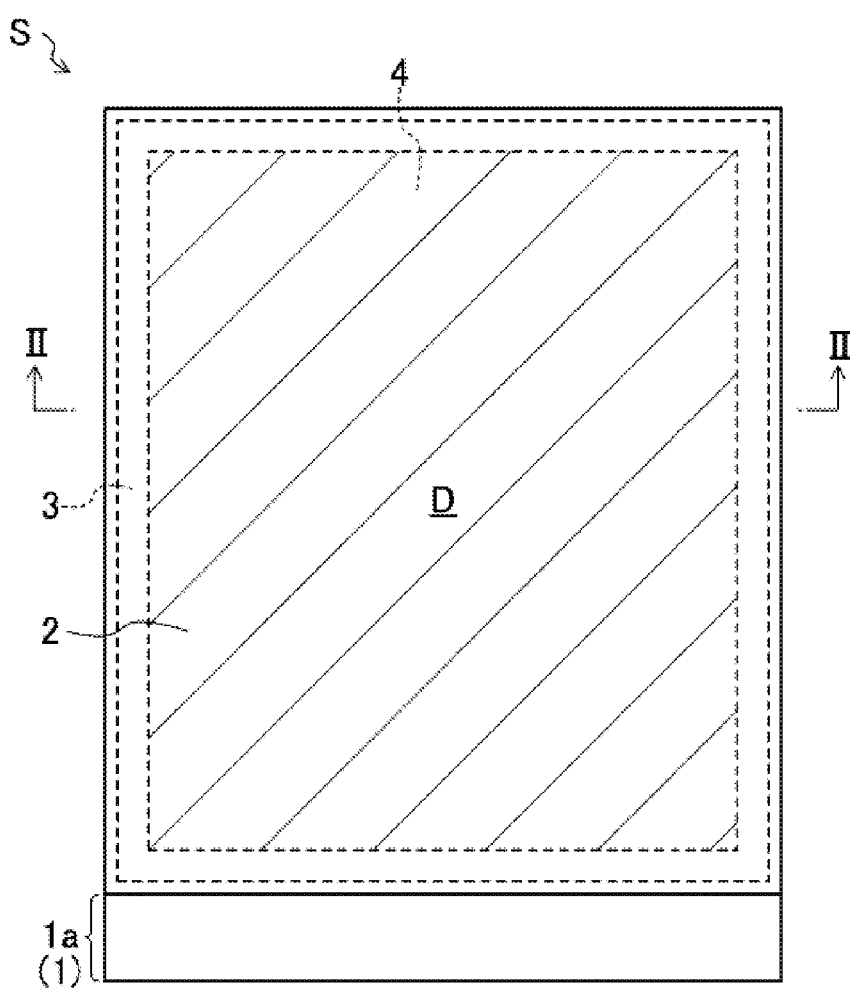
FIG. 1 is a plan view that schematically shows a liquid crystal display device according to Embodiment 1.
Figure 2:
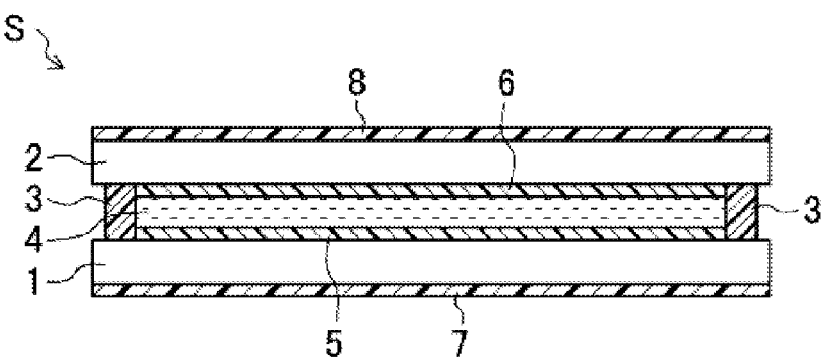
FIG. 2 is a cross-sectional view showing a cross-sectional structure along the line II-II of FIG. 1.

FIG. 1 is a schematic plan view of a liquid crystal display device S as a display device of Embodiment 1. FIG. 2 is a schematic cross-sectional view showing a cross-sectional structure along the line II-II of FIG. 1. A polarizing plate 8 shown in FIG. 2 is not shown in FIG. 1.

<Configuration of Liquid Crystal Display Device S>

The liquid crystal display device S is provided with a TFT substrate 1 and an opposite substrate 2 disposed so as to face each other, a rectangular frame shaped sealing member 3 that bonds respective outer edges of the TFT substrate 1 and the opposite substrate 2, and a liquid crystal layer 4 sealed inside the sealing member 3 between the TFT substrate 1 and the opposite substrate 2.

The liquid crystal display device S has a display region D for displaying images in a region where the TFT substrate 1 and the opposite substrate 2 face each other inside the sealing member 3, that is, in a region where the liquid crystal layer 4 is provided, and has a terminal region 1a outside of the display region D in which the TFT substrate 1 protrudes beyond the opposite substrate 2 and is exposed to the outside. Although not shown in the figure, integrated circuit chips, wiring boards, and the like are mounted on the terminal region 1a through anisotropic conductive films (referred to as ACFs below) or the like, thereby allowing display signals to be inputted from an external circuit to the device.

The TFT substrate 1 and the opposite substrate 2 are formed in a rectangular shape, for example, and as shown in FIG. 2, are respectively provided with alignment films 5 and 6 on inner surfaces that face each other and polarizing plates 7 and 8 on outer surfaces. The liquid crystal layer 4 is made of a nematic liquid crystal material that has electrooptic characteristics.

Figure 3:
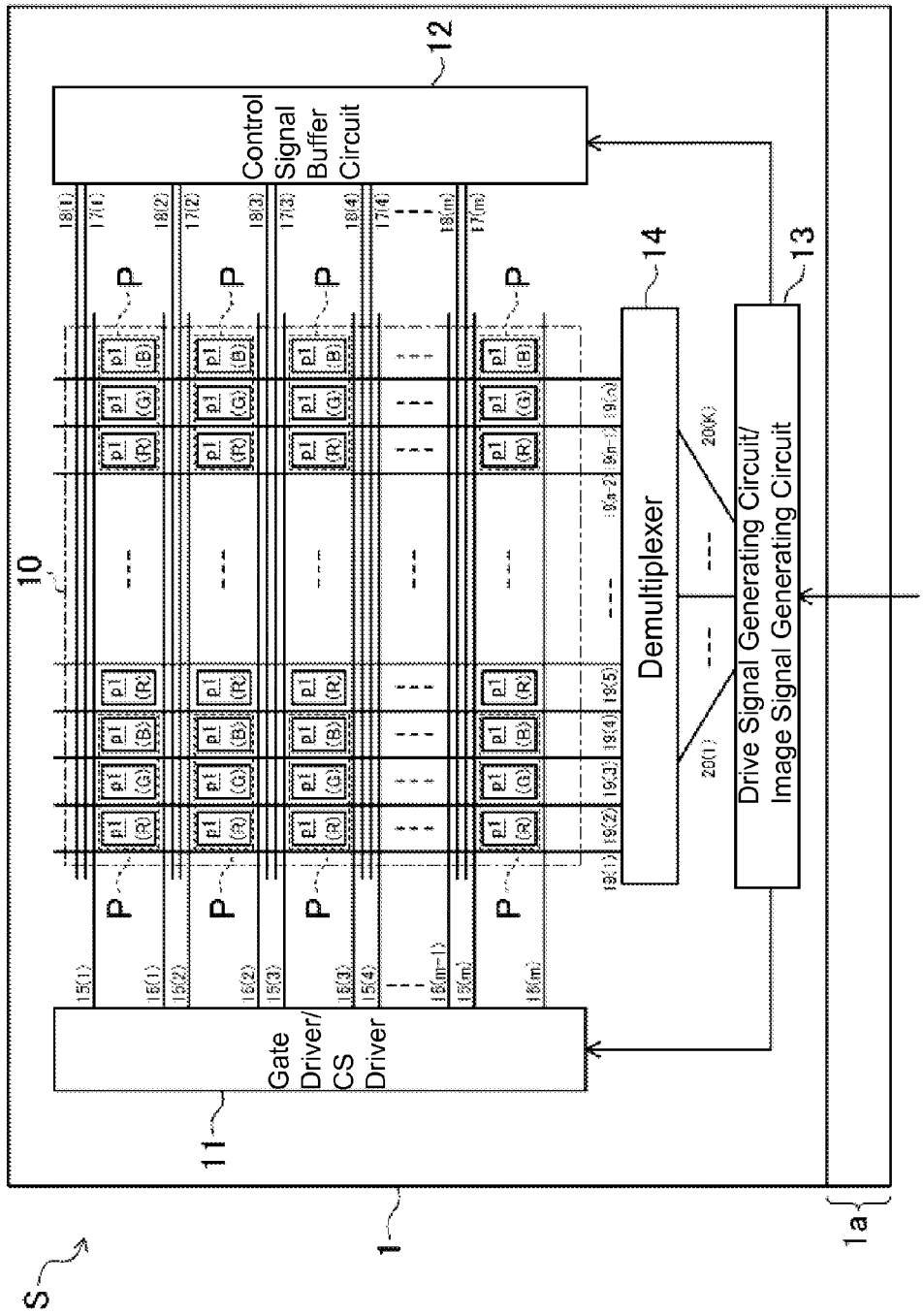
FIG. 3 is a block diagram that schematically shows a circuit configuration of the liquid crystal display device of Embodiment 1.

FIG. 3 is a block diagram showing a schematic circuit configuration in the liquid crystal display device S.

The liquid crystal display device S includes a pixel array 10, a gate driver/CS driver 11, a control signal buffer circuit 12, a drive signal generating circuit/image signal generating circuit 13, a demultiplexer 14, gate wiring lines 15(l) to 15(m), storage capacitance wiring lines 16(l) to 16(m), input/output control wiring lines 17(l) to 17(m), high power wiring lines 18(l) to 18(m), source wiring lines 19(l) to 19(n), and output signal wiring lines 20(l) to 20(k). Here, "m," "n," and "k" are integers. Below, the gate wiring lines 15(l) to 15(m) will be simply referred to as gate wiring lines 15 collectively, the storage capacitance wiring lines 16(l) to 16(m) will be simply referred to as storage capacitance wiring lines 16 collectively, the input/output control wiring lines 17(l) to 17(m) will be simply referred to as input/output wiring lines 17 collectively, the high power wiring lines 18(l) to 18(m) will be simply referred to as high power wiring lines 18 collectively, the source wiring lines 19(l) to 19(n) will be simply referred to as source wiring lines 19 collectively, and the output signal wiring lines 20(*l*) to 20(*k*) will be simply referred to as output signal wiring lines 20 collectively.

The pixel array 10 is made of a plurality of pixels P arranged in a matrix, and constitutes the display region D. Each pixel P is constituted of a group of sub-pixels p1 of red (R), green (G), and blue (B). Although FIG. 3 shows three color sub-pixels p1 arranged side by side in a stripe shape, even if the three color sub-pixels p1 are arranged in a delta pattern, mosaic pattern (diagonal pattern), or other patterns, it does not affect the main point of this patent.

The respective sub-pixels p1 are divided by the gate wiring lines 15, the storage capacitance wiring lines 16, the input/output control wiring lines 17, the high power wiring lines 18, and the source wiring lines 19. The gate wiring lines 15 and the storage capacitance wiring lines 16 are extended in the row direction of the pixel array 10, and are connected to the gate driver/CS driver 11 at one ends. For example, each gate wiring line 15 is arranged on the upper side of a row, which is controlled by that gate wiring line 15, in the pixel array 10 in FIG. 3, and each storage capacitance wiring line 16 is arranged on the lower side of a row, which is controlled by that storage capacitance wiring line 16, in the pixel array 10 in FIG. 3. Similarly, the input/output control wiring lines 17 and the high power wiring lines 18 are extended in the row direction of the pixel array 10, and are connected to the control signal buffer circuit 12 at one ends. For example, each input/output wiring line 17 is arranged on the upper side of a gate wiring line 15 in a row, which is controlled by that input/output wiring line 17, in the pixel array 10 in FIG. 3, and each high power wiring line 18 is arranged on the upper side of an input/output control wiring line 17 in a row, which is controlled by that high power wiring line 18, in the pixel array 10 in FIG. 3.

The gate driver/CS driver 11 is a drive control circuit that controls a drive of the respective sub-pixels p1 through the gate wiring lines 15 and the storage capacitance wiring lines 16. The control signal buffer circuit 12 is a drive control circuit that controls a drive of the respective sub-pixels p1 through the input/output control wiring lines 17 and the high power wiring lines 18.

The drive signal generating circuit/image signal generating circuit 13 is a drive control circuit that conducts normal full color display and binary memory display by controlling a drive of the gate driver/CS driver 11 and the control signal buffer circuit 12. Although not shown in the figure, the drive signal generating circuit/image signal generating circuit 13 includes an image data processing circuit, input/output interface, a command decoder, a timing control circuit, and a writing/reading circuit. The timing control circuit is a circuit that generates timing signals used in an operation of the binary memory display, and also doubles as a circuit that generates timing signals such as gate start pulse, gate clock, source start pulse, and source clock that are used in an operation of the normal full color display.

The drive signal generating circuit/image signal generating circuit 13 is connected to the demultiplexer 14 through the output signal wiring lines 20. The demultiplexer 14 is a circuit that allocates and outputs a data potential inputted from the drive signal generating circuit/image signal generating circuit 13 through the output signal wiring lines 20 to the corresponding source wiring lines 19.

In an operation of the normal full color display, the drive signal generating circuit/image signal generating circuit 13 outputs multi-gradation image signals from the output terminals, and supplies analog data potentials to the source wiring lines 19 through the output signal wiring lines 20 and the demultiplexer 14. At the same time, the drive signal generating circuit/image signal generating circuit 13 outputs a control signal to drive the gate driver/CS driver 11. This way, the data potentials are written into the respective pixels P (three color sub-pixels p1), thereby making it possible to display multi-gradation still image and video.

Upon start of an operation of the binary memory display, the drive signal generating circuit/image signal generating circuit 13 supplies data potentials to be stored in the sub-pixels p1 from the output terminals to the source wiring lines 19 through the output signal wiring lines 20 and the demultiplexer 14, and outputs a control signal to drive the gate driver/CS driver 11. Further, the drive signal generating circuit/image signal generating circuit 13 outputs a control signal to drive the control signal buffer circuit 12 at the same time. This way, the data potentials are written and stored in the respective pixels P (three color sub-pixels p1), and the data potentials stored in the respective pixels P (three color sub-pixels p1) are read out.

However, the data potentials written and stored in the respective pixels P may only be used for display, and therefore, a read-out operation for the data potentials from the respective pixels P is not necessarily performed. The data potentials outputted from the drive signal generating circuit/image signal generating circuit 13 to the source wiring lines 19 through the demultiplexer 14 upon start of the operation of the binary memory display are binary logic levels of high (active level) and low (non-active level).

Figure 4:
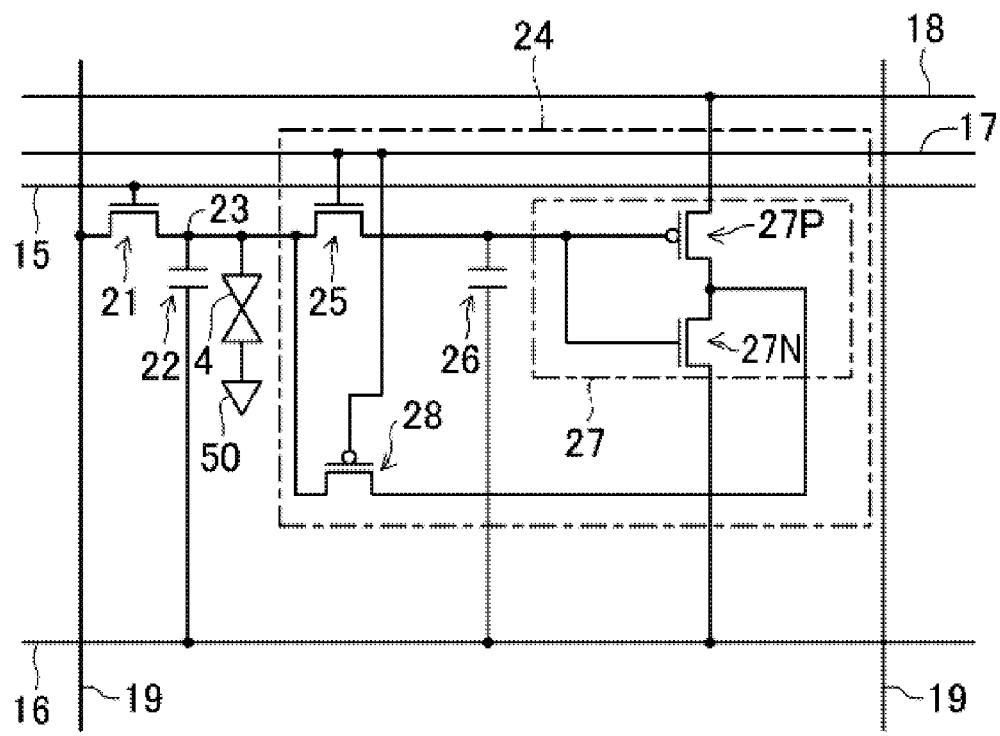
FIG. 4 is an equivalent circuit diagram of a sub-pixel of the liquid crystal display device of Embodiment 1.

FIG. 4 shows an equivalent circuit diagram of one sub-pixel p1. In FIG. 4, a configuration not including the liquid crystal layer 4 and the common electrode 50 is an equivalent circuit diagram of one sub-pixel p1 in the TFT substrate 1.

Each sub-pixel p1 is provided with a drive control TFT 21, which is a second input control TFT, a pixel potential capacitance element 22, which is a second capacitance element that stores a data potential inputted through the drive control TFT 21, a pixel electrode 23 connected to the pixel potential capacitance element 22, and a common electrode 50 disposed to face the pixel electrode 23, and a liquid crystal layer 4 is disposed between the pixel electrode 23 and the common electrode 50.

The drive control TFT 21 is constituted of an n-type TFT. In the drive control TFT 21, the gate is connected to a gate wiring line 15, the source is connected to a source wiring line 19, and the drain is connected to one end of the pixel potential capacitance element 22 and a pixel electrode 23. The drive control TFT 21 controls an input of an analog potential or binary logic level from the source wiring line 19 to the pixel potential capacitance element 22 and the pixel electrode 23. The other end of the pixel potential capacitance element 22 is connected to a storage capacitance wiring line 16.

Each sub-pixel p1 further includes a memory circuit 24 connected to the pixel potential capacitance element 22 and the pixel electrode 23.

The memory circuit 24 includes: an input control TFT 25, which is a first input control TFT that controls an input of the binary logic level inputted through the drive control TFT 21 in the operation of the binary memory display; a memory capacitance element 26, which is a first capacitance element that stores the binary logic level inputted through the input control TFT 25; an inverter circuit 27, which is a control circuit that reverses the polarity of the binary logic level stored in the memory capacitance element 26; and an output control TFT 28 that controls an output of the binary logic level having the polarity reversed by the inverter circuit 27 to the pixel potential capacitance element 22 and the pixel electrode 23.

The input control TFT 25 is constituted of an n-type TFT, and the output control TFT 28 is constituted of a p-type TFT. In the input control TFT 25, the source is connected to the pixel potential capacitance element 22 and the pixel electrode 23, and the drain is connected to the inverter circuit 27. In the output control TFT 28, the source is connected to the inverter circuit 27, and the drain is connected to the pixel potential capacitance element 22 and the pixel electrode 23. The respective gates of the input control TFT 25 and the output control TFT 28 are connected to a common input/output control wiring line 17. With this configuration, it is possible to reduce the number of wiring lines as compared with a case in which the respective gates of the input control TFT 25 and the output control TFT 28 are connected to separate wiring lines and controlled independently from each other. As a result, the aperture ratio of each sub-pixel p1 can be improved, and higher resolution can be achieved with ease.

The inverter circuit 27 includes an n-type TFT 27N and a p-type TFT 27P, which are operation control TFTs, connected in series. The n-type TFT 27N and the p-type TFT 27P have the respective gate connected to the drain of the input control TFT 25 and the memory capacitance element 26, and are turned on and off based on the binary logic level stored in the memory capacitance element 26. The respective drains of the n-type TFT 27N and the p-type TFT 27P are connected to each other, and are connected to the source of the output control TFT 28. The source of the n-type TFT 27N is connected to a storage capacitance wiring line 16, and the source of the p-type TFT 27P is connected to a high power wiring line 18. As described above, the control circuit of the memory circuit 24 is the inverter circuit 27 constituted of the two TFTs 27N and 27P, and therefore, it is possible to reduce the number of elements constituting the control circuit as compared with a case in which an SRAM constituted of five TFTs and the like is used as the control circuit, for example. This makes it possible to reduce an arrangement area of the control circuit, and as a result, higher resolution pixels can be achieved.

<Configuration of TFT Substrate 1>

Figure 5:
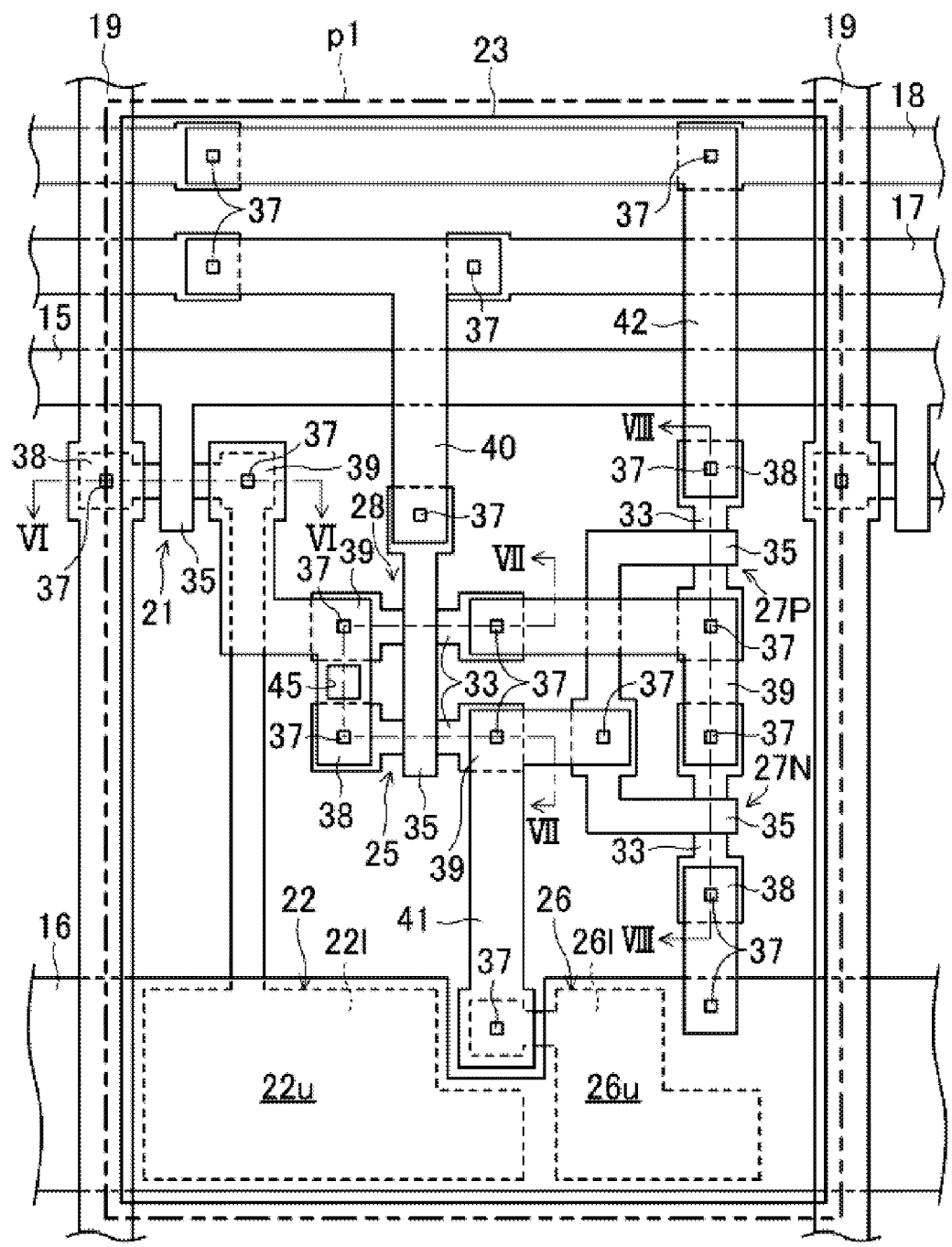
FIG. 5 is a plan view showing a configuration of one sub-pixel of a TFT substrate of Embodiment 1.
Figure 6:
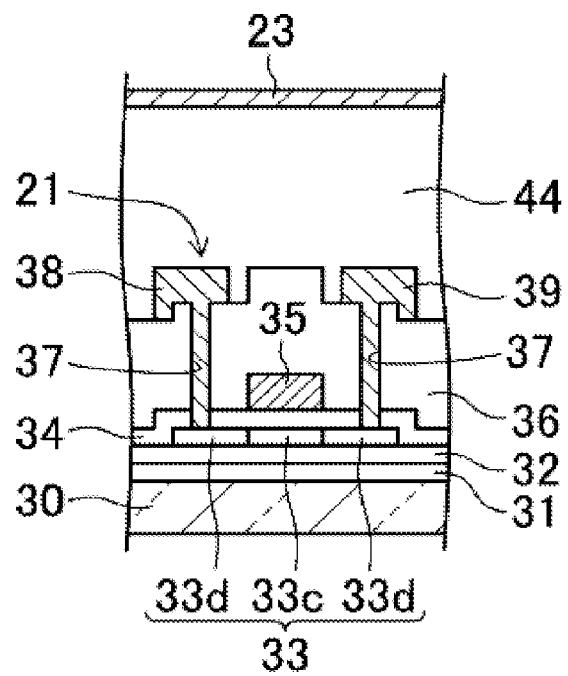
FIG. 6 is a cross-sectional view showing a cross-sectional structure along the line VI-VI of FIG. 5.
Figure 7:
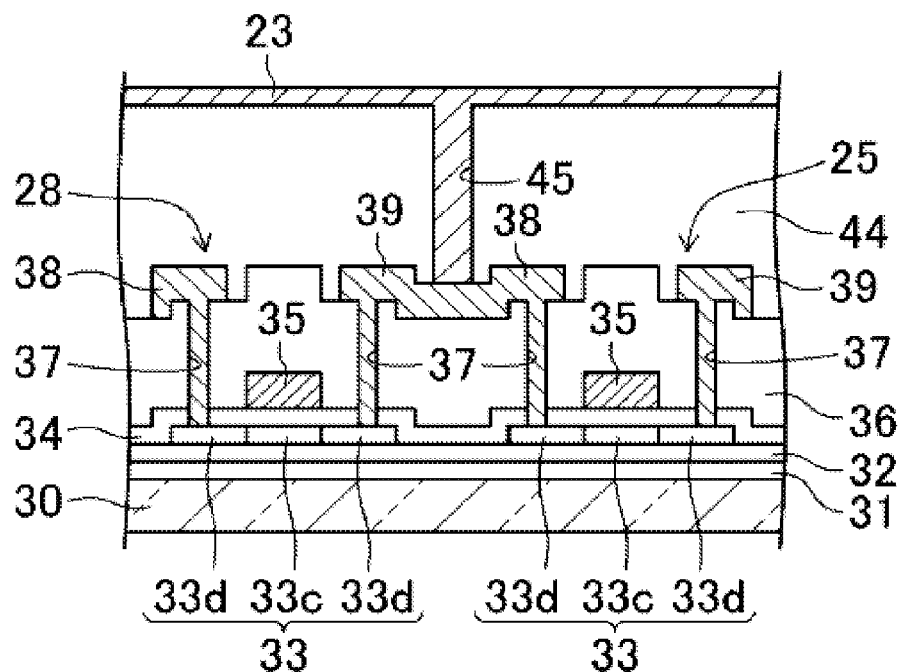
FIG. 7 is a cross-sectional view showing a cross-sectional structure along the line VII-VII of FIG. 5.
Figure 8:
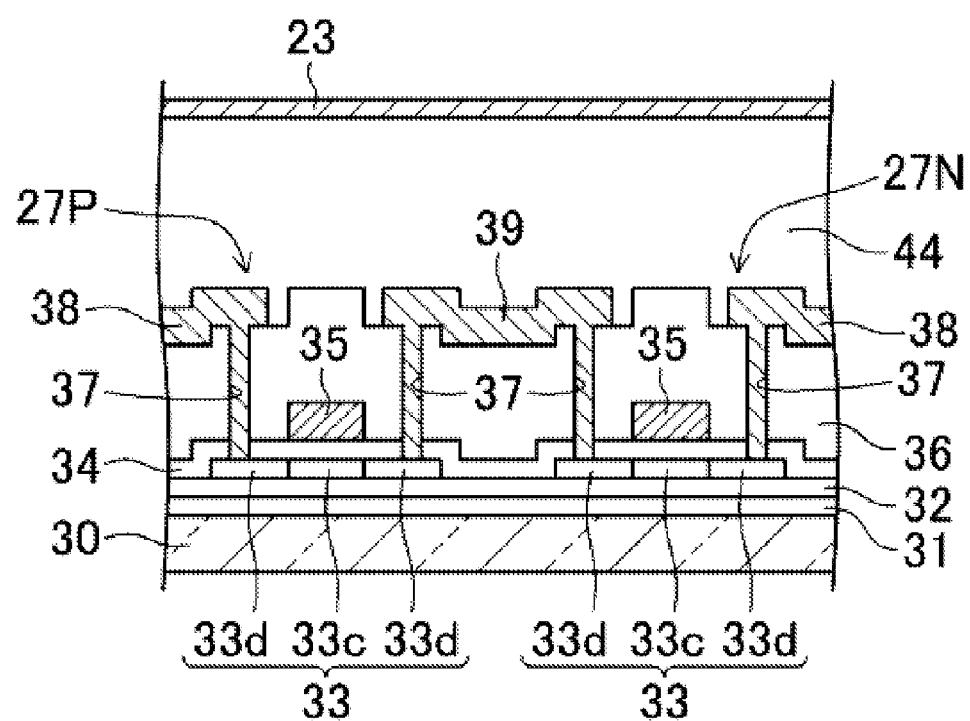
FIG. 8 is a cross-sectional view showing a cross-sectional structure along the line VIII-VIII of FIG. 5.

FIG. 5 is a plan view that shows a specific configuration of one sub-pixel p1 in the TFT substrate 1. FIG. 6 is a cross-sectional view showing a cross-sectional structure along the line VI-VI of FIG. 5. FIG. 7 is a cross-sectional view showing a cross-sectional structure along the line VII-VII of FIG. 5. FIG. 8 is a cross-sectional view showing a cross-sectional structure along the line VIII-VIII of FIG. 5.

As shown in FIGS. 6 to 8, the TFT substrate 1 has an insulating substrate 30 such as a glass substrate as a base substrate, and on the insulating substrate 30, a silicon nitride film 31 and a silicon oxide film 32 are formed in this order as base films. On these base films 31 and 32, the gate wiring lines 15, the storage capacitance wiring lines 16, the input/output control wiring lines 17, the high power wiring lines 18, the source wiring lines 19, the drive control TFTs 21, the pixel potential capacitance elements 22, the pixel electrodes 23, and the memory circuits 24 (input control TFTs 25, memory capacitance elements 26, inverter circuits 27, and output control TFTs 28) are provided.

The drive control TFT 21 is a top-gate TFT, and as shown in FIG. 6, includes a semiconductor layer 33 made of crystalline silicon on the base films 31 and 32; a gate insulating film 34 covering the semiconductor layer 33; a gate electrode 35 disposed on the gate insulating film 34 so as to overlap the semiconductor layer 33; a first interlayer insulating film 36 covering the gate electrode 35; and a source electrode 38 and a drain electrode 39 disposed on the first interlayer insulating film 36 so as to be separated from each other. The semiconductor layer 33 has a pair of high concentration impurity regions 33d separated from each other, and a channel region 33c formed between the pair of high concentration impurity regions 33d. The gate electrode 35 is a part of a gate wiring line 15 protruding to the bottom side of FIG. 5, and overlaps the channel region 33c of the semiconductor layer 33. In the first interlayer insulating film 36 and the gate insulating film 34, a pair of contact holes 37 is formed so as to respectively reach the high concentration impurity regions 33d of the semiconductor layer 33. The source electrode 38 and the drain electrode 39 are connected to different high concentration impurity regions 33d, respectively, through the contact holes 37. The source electrode 38 is made of a part of a source wiring line 19.

As shown in FIG. 5, the pixel potential capacitance element 22 has a structure in which a lower electrode 22l and an upper electrode 22u face each other through the gate insulating film 34. The lower electrode 22l is formed integrally with the semiconductor layer 33 of the drive control TFT 21, which is extended to an area below a storage capacitance wiring line 16. The upper electrode 22u is made of a part of a storage capacitance wiring line 16.

As shown in FIG. 7, the input control TFT 25 and the output control TFT 28 have a top gate structure similar to the drive control TFT 21. As shown in FIG. 5, the gate electrodes 35 of the input control TFT 25 and the output control TFT 28 are formed integrally with each other, and are connected to a first connecting wiring line 40 formed on the first interlayer insulating film 36 through a contact hole 37 formed in the first interlayer insulating film 36 and the gate insulating film 34. The first connecting wiring line 40 extends over a gate wiring line 15 having the first interlayer insulating film 36 interposed therebetween, and is connected to an input/output wiring line 17 through a contact hole 37. The source electrode 38 of the input control TFT 25 and the drain electrode 39 of the output control TFT 28 are formed integrally with each other, and are also formed integrally with the drain electrode 39 of the drive control TFT 21.

The memory capacitance element 26 has a structure in which a lower electrode 26l and an upper electrode 26u face each other through the gate insulating film 34. The lower electrode 26l is connected to a second connecting wiring line 41 formed on the first interlayer insulating film 36 through a contact hole 37. The second connecting wiring line 41 is formed integrally with the drain electrode 39 of the input control TFT 25. The upper electrode 26u is made of a part of a storage capacitance wiring line 16.

As shown in FIG. 8, the n-type TFT 27N and the p-type TFT 27P of the inverter circuit 27 also have a top gate structure similar to the drive control TFT 21. As shown in FIG. 5, the gate electrodes 35 of the n-type TFT 27N and the p-type TFT 27P are integrally formed with each other, and are connected to the drain electrode 39 of the input control TFT 25 through a contact hole 37. The source electrode 38 of the n-type TFT 27N is connected to a storage capacitance wiring line 16 through a contact hole 37. On the other hand, the source electrode 38 of the p-type TFT 27P is connected to a third connecting wiring line 42 formed on the first interlayer insulating film 36 through a contact hole 37. The third connecting wiring line 42 extends over a gate wiring line 15 and an input/output control wiring line 17 having the first interlayer insulating film 36 interposed therebetween, and is connected to a high power wiring line 18 through a contact hole 37. The drain electrodes 39 of the n-type TFT 27N and p-type TFT 27P are formed integrally with each other, and are also formed integrally with the source electrode 38 of the output control TFT 28.

In each semiconductor layer 33 of the drive control TFT 21, the input control TFT 25, and the n-type TFT 27N of the inverter circuit 27, which are n-type TFTs, the high concentration impurity regions 33d include an n-type impurity such as phosphorus (P), thereby having a donor level, and the channel region 33c includes a p-type impurity such as boron (B), thereby having an acceptor level. On the other hand, in each semiconductor layer 33 in the p-type TFT 27P of the inverter circuit 27 and the output control TFT 28, which are p-type TFTs, the high concentration impurity regions 33d include a p-type impurity such as boron (B), thereby having an acceptor level, and the channel region 33c has a donor level as a result of being affected by the base films 31 and 32 when forming the semiconductor layer.

The drive control TFT 21, the pixel potential capacitance element 22, the input control TFT 25, the memory capacitance element 26, the respective TFTs 27N and 27P of the inverter circuit 27, and the output control TFT 28 are covered by a second interlayer insulating film 44. On the second interlayer insulating film 44, the pixel electrode 23 is formed. As shown in FIG. 7, the pixel electrode 23 is connected to the drain electrode 39 of the drive control TFT 21, the source electrode 38 of the input control TFT 25, and the drain electrode 39 of the output control TFT 28, which are formed integrally with each other, through a contact hole 45 formed in the second interlayer insulating film 44.

Figure 9:
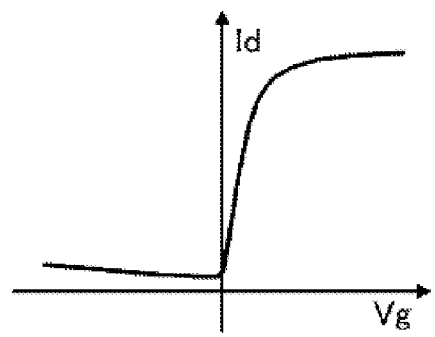
FIG. 9 shows graphs for current-voltage characteristics of respective TFTs of Embodiment 1.
Figure 9:
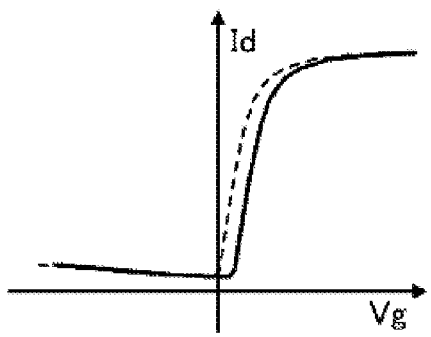
Figure 9:
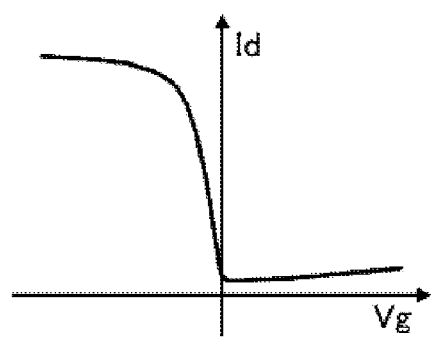
Figure 9:
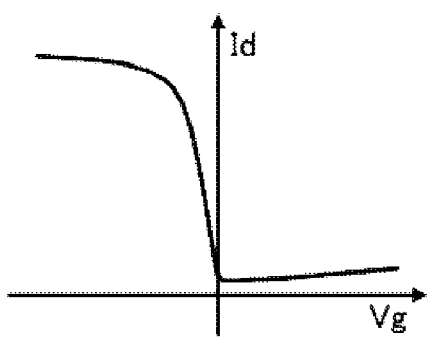

FIG. 9 shows graphs for current-voltage characteristics of TFTs 21, 25, 27N, 27P, and 28 in the present embodiment. FIG. 9(a) shows characteristics of n-type TFTs 21 and 25 other than the TFTs 27N and 27P constituting the inverter circuit 27. FIG. 9(b) shows characteristics of the n-type TFT 27N of the inverter circuit 27. FIG. 9(c) shows characteristics of the p-type TFT 28 other than the TFTs 27N and 27P constituting the inverter circuit 27. FIG. 9(d) shows characteristics of the p-type TFT 27P of the inverter circuit 27. The broken line in FIG. 9(b) shows a case in which the n-type TFT 27N of the inverter circuit 27 has the same current-voltage characteristics as those of other n-type TFTs. The same is true for FIG. 20(d) and FIGS. 23(b) and 23(d), which will be later referred to.

In the n-type TFT 27N of the inverter circuit 27 of the present embodiment, the concentration of the p-type impurity (boron, for example) that generates an acceptor level in the channel region 33c is higher than the concentration of the p-type impurity in channel regions 33c of other n-type TFTs such as the drive control TFT 21 and the input control TFT 25. As a result, as shown in FIGS. 9(a) and 9(b), in the n-type TFT 27N of the inverter circuit 27, the absolute value of the threshold voltage thereof is made greater by about 0.5V, for example, than that of the other n-type TFTs 21 and 25. On the other hand, as shown in FIGS. 9(c) and 9(d), the current-voltage characteristics of the p-type TFT 27P of the inverter circuit 27 are the same as the current-voltage characteristics of other p-type TFTs such as the output control TFT 28.

<Configuration of Opposite Substrate 2>

Although not shown in the figure, the opposite substrate 2 is provided with a black matrix formed on a base substrate, which is an insulating substrate such as a glass substrate, in a grid pattern so as to correspond to the gate wiring lines 15 and the source wiring lines 19, a plurality of color filters made of red layers (R), green layers (G), and blue layers (B) arranged in a periodic pattern so as to correspond to the respective sub-pixels p1 in the grids of the black matrix, a common electrode 50 formed so as to cover the black matrix and the respective color filters and so as to face the group of pixel electrodes 23, and photospacers formed on the common electrode 50 in a columnar shape.

<Operation of Liquid Crystal Display Device S>

The liquid crystal display device S configured in the manner described above has a full color display scheme, which is a first display scheme for conducting a normal full color display (multi-gradation display) in which multi-gradation still image and video are displayed, and a binary memory display scheme, which is a second display scheme for conducting the binary memory display (two-gradation display) in which a still image is displayed by holding the data potential written in each sub-pixel p1 by the memory circuit 24 and conducting a refresh operation while reversing the polarity of the data potential.

In a display operation by the full color display scheme, a gate signal is outputted to the gate wiring lines 15 from the gate driver/CS driver 11 in every prescribed scanning period, thereby sequentially selecting and driving the gate wiring lines 15. The drive control TFT 21 of each of the sub-pixels p1 in the same row in the pixel array 10 is turned on when the corresponding gate wiring line 15 is selected. At the same time as selecting the gate wiring line 15, an analog data potential is outputted to each source wiring line 19 from the drive signal generating circuit/image signal generating circuit 13 through the demultiplexer 14, and electrical charges corresponding to the data potential are charged to the pixel potential capacitance element 22 and are written into the pixel electrode 23 of each of the sub-pixels p1 through the drive control TFT 21 in the ON state. Such a writing operation of the data potentials is conducted on all rows in the pixel array 10 in a line-sequential manner. As a result, in each sub-pixel p1, a prescribed voltage is applied to the liquid crystal layer 4 between the pixel electrode 23 and the common electrode 50, and by controlling the orientation of liquid crystal molecules in accordance with the applied voltage, the light transmittance of the liquid crystal layer 4 is adjusted. By representing a color in each pixel P by combining transmitted light in three color sub-pixels p1, a full color image is displayed in the display region D.

During the display operation of the full color display scheme, the input/output control wiring lines 17 are applied with a low potential, the input control TFTs 25 are turned off, and the output control TFTs 28 are turned on.

Figure 10:
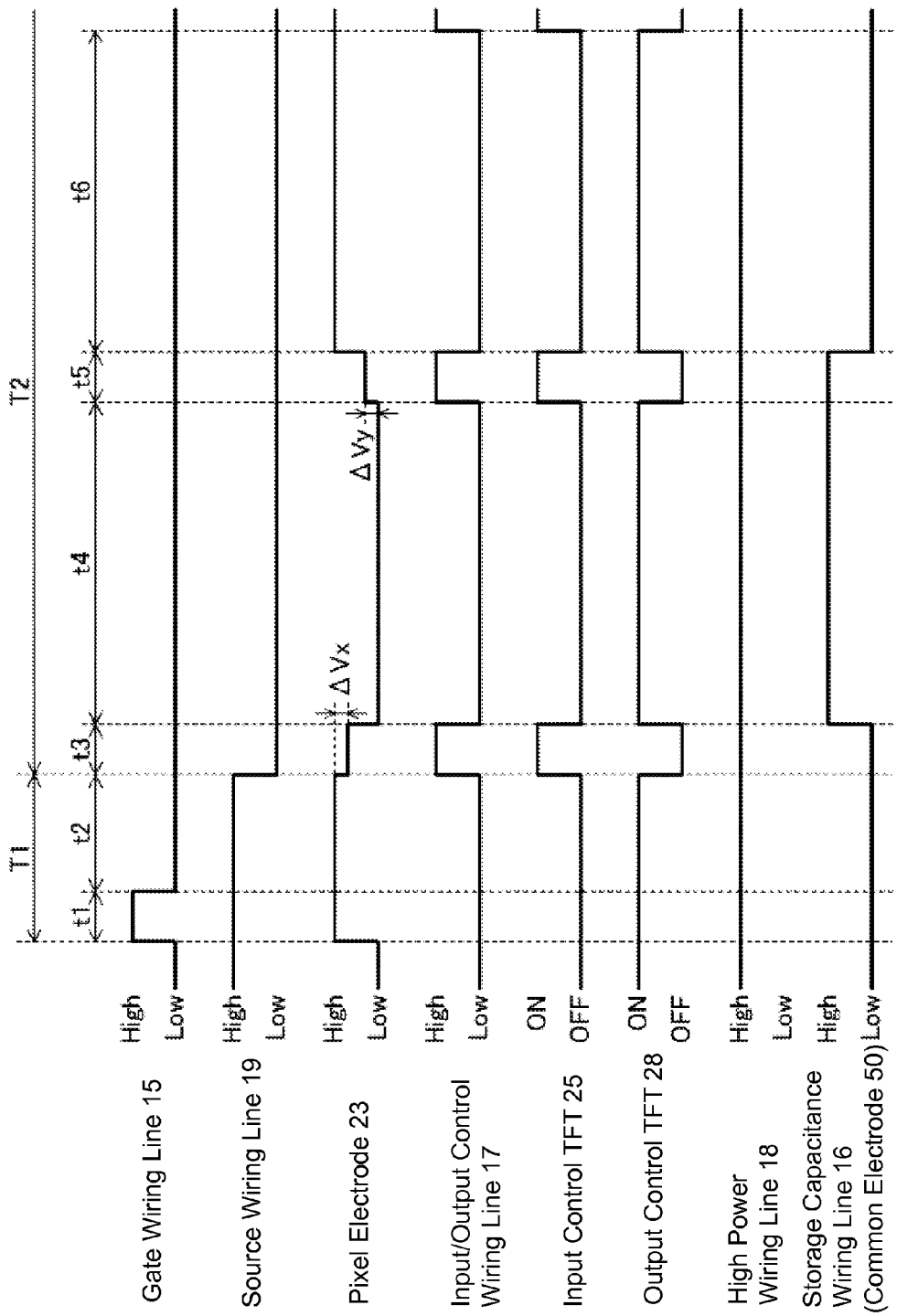
FIG. 10 is a timing chart of signal waveforms showing an operation of binary memory display in the liquid crystal display device of Embodiment 1.

FIG. 10 is a timing chart of signal waveforms showing a display operation by the binary memory display scheme.

The display operation by the binary memory display scheme has a writing period T1 and a refresh period T2.

The writing period T1 is the last frame of the normal display by the full color display scheme when the display operation of the full color display scheme is switched to the display operation of the binary memory display scheme, during which a data potential is written into the pixel potential capacitance element 22 and the pixel electrode 23 in each sub-pixel p1. The writing period T1 is made of successive two periods of a first period t1 and a second period t2. In the writing period T1, writing operations are conducted on the pixel potential capacitance elements 22 and the pixel electrodes 23 in the respective sub-pixels p1 in a line-sequential manner, and therefore, the first period t1 for each row of the pixel array 10 is set so as not to overlap each other. Thus, the wiring period T1 for each row starts at a different timing. The completion timing of the second period t2, that is, the completion timing of the writing period T1 is the same in all rows.

During the first period t1, a gate wiring line 15 is selected, and the potential thereof is set to high level. On the other hand, the potential of the input/output control wiring line 17 is maintained at low level. As a result, the drive control TFT 21 is turned on, and therefore, electrical charges corresponding to a potential of the binary logic level (high, in this example)

outputted to the source wiring line 19 are charged to the pixel potential capacitance element 22 and written into the pixel electrode 23.

In the subsequent second period t2, the potential of the gate wiring line 15 is set to low level, and the potential of the input/output control wiring line 17 is maintained at low level. As a result, the drive control TFT 21 is turned off, thereby separating the pixel potential capacitance element 22, the pixel electrode 23, and the memory circuit 24 from the source wiring line 19, and the potentials of the pixel potential capacitance element 22 and the pixel electrode 23 are maintained at high level.

Next, the refresh period T2 starts. The refresh period T2 is a period in which the data potential written into the pixel potential capacitance element 22 and the pixel electrode 23 during the writing period T1 is held while conducting a refresh operation. The refresh period T2 made of third to sixth periods t3 to t6 starts at the same time in all rows.

In the third period t3, the potential of the input/output control wiring line 17 is set to high level, thereby turning the input control TFT 25 on and turning the output control TFT 28 off. As a result, the pixel potential capacitance element 22 and the memory capacitance element 26 are connected in parallel, and electrical charges are allowed to move between the two capacitance elements 22 and 26, and because the potential of the pixel potential capacitance element 22 is transferred to the memory capacitance element 26, the potential of the memory capacitance element 26 becomes high. The potential of the pixel electrode 23 is slightly reduced by a voltage ΔVx, but is still within a high potential range.

In the subsequent fourth period t4, the potential of the input/output control wiring line 17 is set to low level, thereby turning the input control TFT 25 off and turning the output control TFT 28 on. As a result, the pixel potential capacitance element 22 and the memory capacitance element 26 are separated from each other, and maintain the high potential, respectively. The high potential held by the memory capacitance element 26 is converted to a reverse potential (low, in this example) having the opposite polarity as a result of the n-type TFT 27N being turned on and the p-type TFT 27P being turned off in the inverter circuit 27 in accordance with the potential. Because the output control TFT 28 is on, the low potential is outputted from the inverter circuit 27 through the output control TFT 28, and electrical charges corresponding to the potential are charged to the pixel potential capacitance element 22 and are written into the pixel electrode 23. This way, the potential of the pixel potential capacitance element 22 and the pixel electrode 23 is refreshed to low level.

In the subsequent fifth period t5, the potential of the input/output control wiring line 17 is set to high level again, thereby turning the input control TFT 25 on and turning the output control TFT 28 off. As a result, the pixel potential capacitance element 22 and the memory capacitance element 26 are connected in parallel, and electrical charges are allowed to move between the two capacitance elements 22 and 26, and because the potential of the pixel potential capacitance element 22 is transferred to the memory capacitance element 26, the potential of the memory capacitance element 26 becomes low. The potential of the pixel electrode 23 is slightly raised by a voltage ΔVy, but is still within a low potential range.

In the subsequent sixth period t6, the potential of the input/output control wiring line 17 is set to low level, thereby turning the input control TFT 25 off and turning the output control TFT 28 on. As a result, the pixel potential capacitance element 22 and the memory capacitance element 26 are separated from each other, and maintain the low potential, respectively. The low potential held by the memory capacitance element 26 is converted to a potential (high, in this example) upon writing operation, which has the opposite polarity, as a result of the p-type TFT 27P being turned on and the n-type TFT 27N being turned off in the inverter circuit 27 in accordance with the potential. Because the output control TFT 28 is on, the high potential is outputted from the inverter circuit 27 through the output control TFT 28, and electrical charges corresponding to the potential are charged to the pixel potential capacitance element 22 and are written into the pixel electrode 23. This way, the potential of the pixel potential capacitance element 22 and the pixel electrode 23 is refreshed to high level.

When this refresh operation is conducted, because the potential of the memory capacitance element 26 is low while the potential of the pixel potential capacitance element 22 is high, an off leak current would be generated in the input control TFT 25, and the potential of the memory capacitance element 26 is gradually increased to a high level over time. However, in the present embodiment, the absolute value of the threshold voltage in the n-type TFT 27N of the inverter circuit 27 is made relatively large, and therefore, even when the potential of the memory capacitance element 26 is increased slightly toward high level, the n-type TFT 27N is unlikely to be turned on. This makes it possible to prevent an erroneous operation of the inverter circuit 27.

During the refresh period T2, the third to sixth periods t3 to t6 are repeated until the next writing period T1 starts. Even when a low potential is written into the pixel electrode 23 during the first period t1 of the writing period T1, the input/output control wiring line 17 is applied with a potential having a similar waveform. In this case, the potential waveform of the pixel electrode 23 becomes a reverse of the potential waveform of FIG. 10. The potential of the common electrode 50 is switched between high and low levels at the same time as when the potential of the pixel electrode 23 is refreshed. This way, a prescribed voltage is continuously applied to the liquid crystal layer 4 even while refreshing the data potential of the pixel electrode 23, and therefore, each sub-pixel p1 is maintained to be on or off. In the present embodiment, because one pixel P is constituted of three color sub-pixels p1 of red (R), green (G), and blue (B), it is possible to conduct multi-color display with eight (the cube of two) colors in the binary memory display.

—Manufacturing Method—

Figure 11:
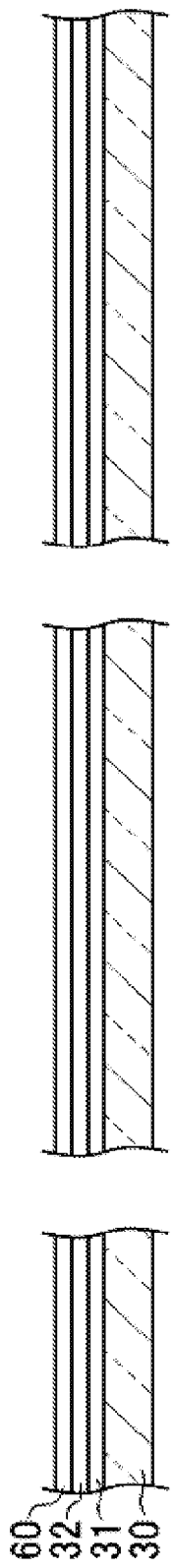
FIG. 11 shows cross-sectional views of sections corresponding to FIGS. 6 to 8, respectively, which illustrate a semiconductor layer forming process in a manufacturing method for a TFT substrate of Embodiment 1.
Figure 11:
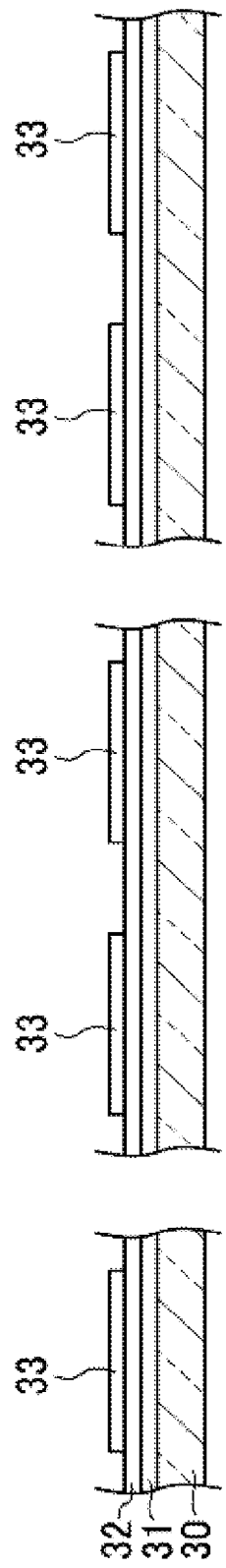
Figure 12:
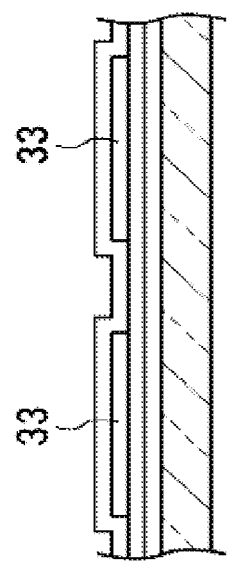
FIG. 12 shows cross-sectional views of sections corresponding to FIGS. 6 to 8, respectively, which illustrate a substrate after a gate insulating film forming process in the manufacturing method for a TFT substrate of Embodiment 1.
Figure 12:
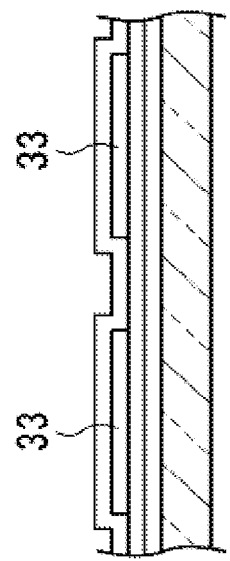
Figure 12:
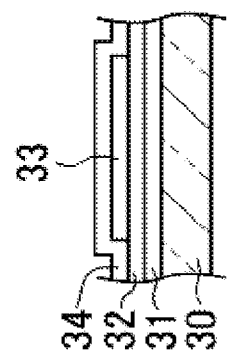
Figure 13:
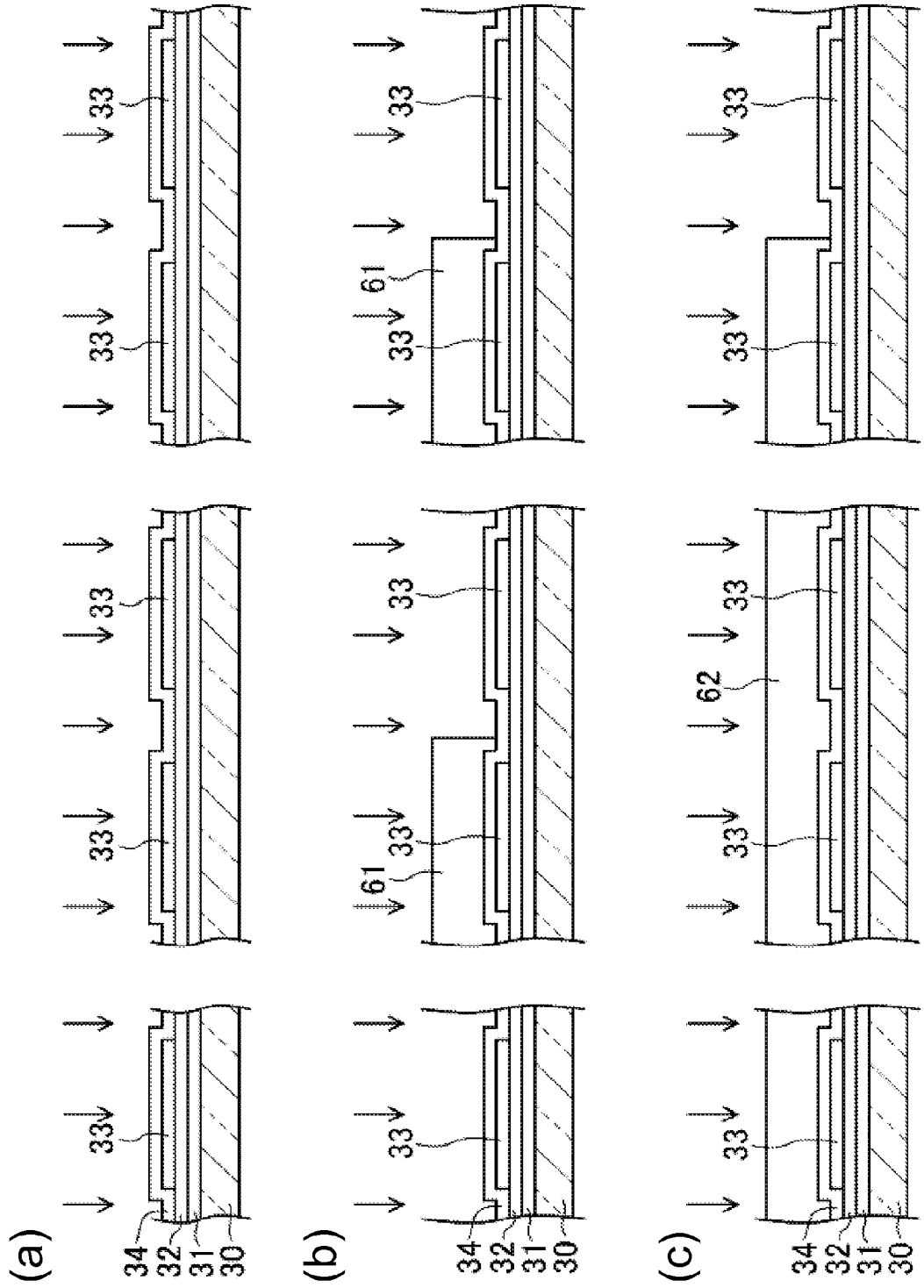
FIG. 13 shows cross-sectional views of sections corresponding to FIGS. 6 to 8, respectively, which illustrate a first impurity doping process in the manufacturing method for a TFT substrate of Embodiment 1.
Figure 14:
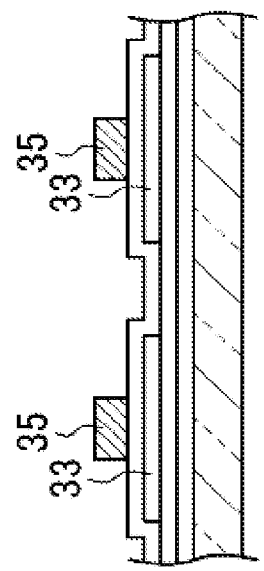
FIG. 14 shows cross-sectional views of sections corresponding to FIGS. 6 to 8, respectively, which illustrate a substrate after a gate electrode forming process in the manufacturing method for a TFT substrate of Embodiment 1.
Figure 14:
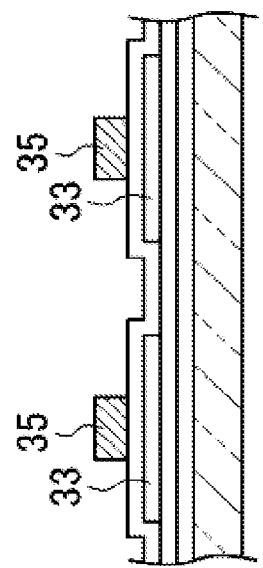
Figure 14:
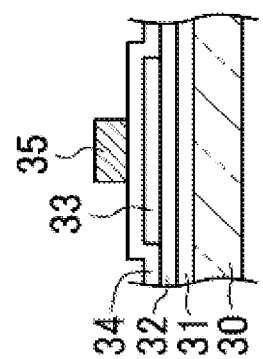
Figure 15:
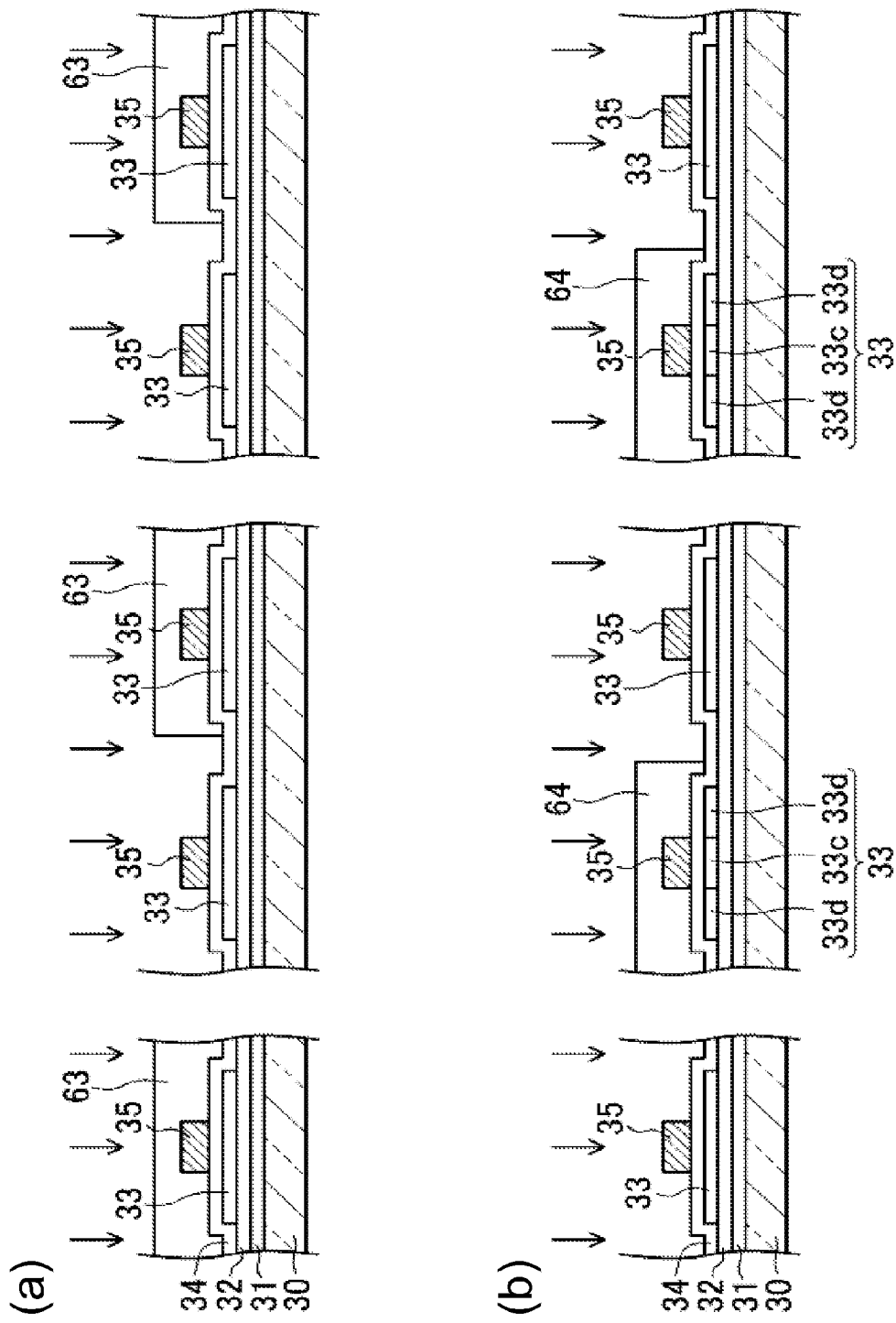
FIG. 15 shows cross-sectional views of sections corresponding to FIGS. 6 to 8, respectively, which illustrate a second impurity doping process in the manufacturing method for a TFT substrate of Embodiment 1.
Figure 16:
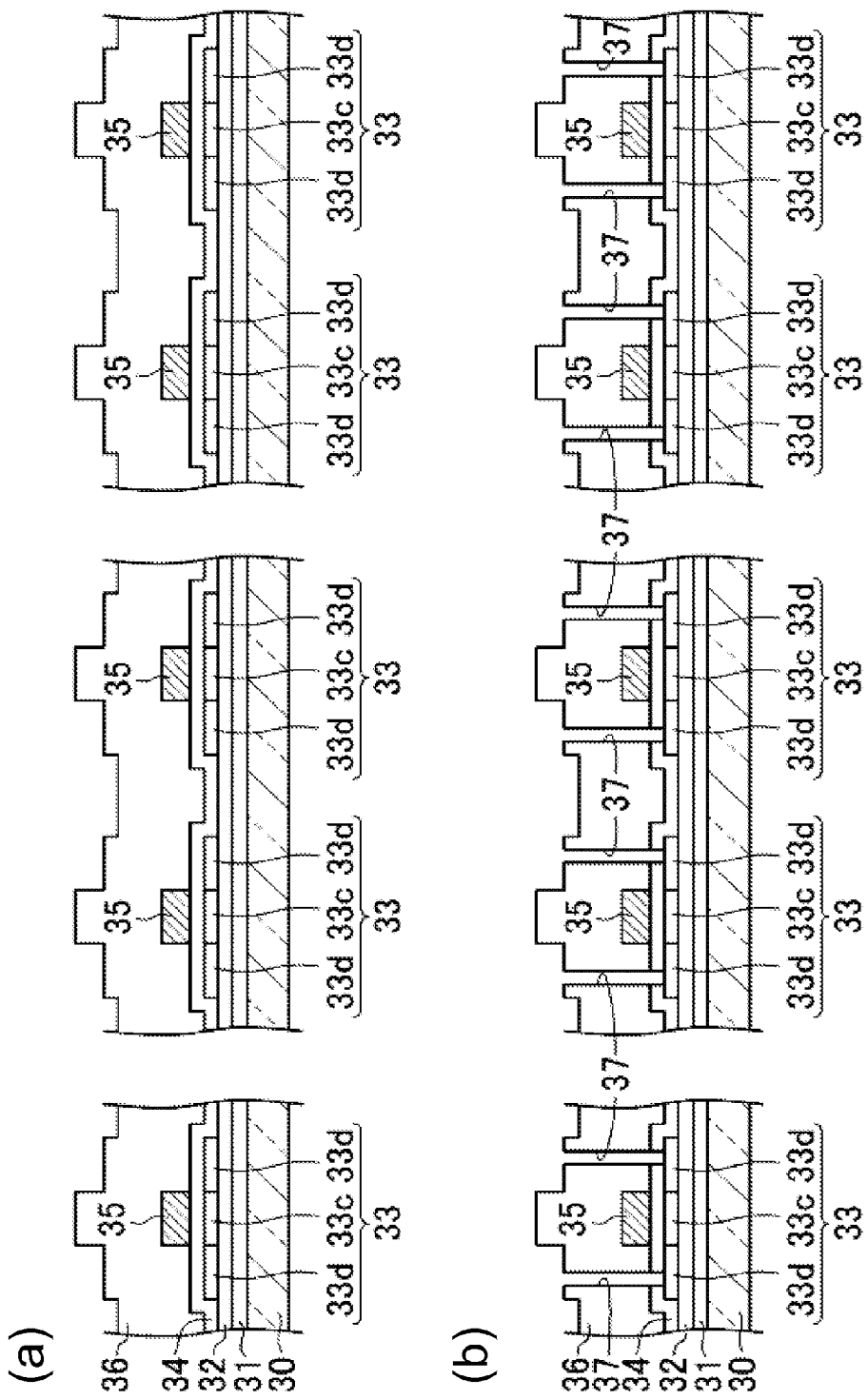
FIG. 16 shows cross-sectional views of sections corresponding to FIGS. 6 to 8, respectively, which illustrate each substrate after a first interlayer insulating film forming process and a contact hole forming process in the manufacturing method for a TFT substrate of Embodiment 1.
Figure 17:
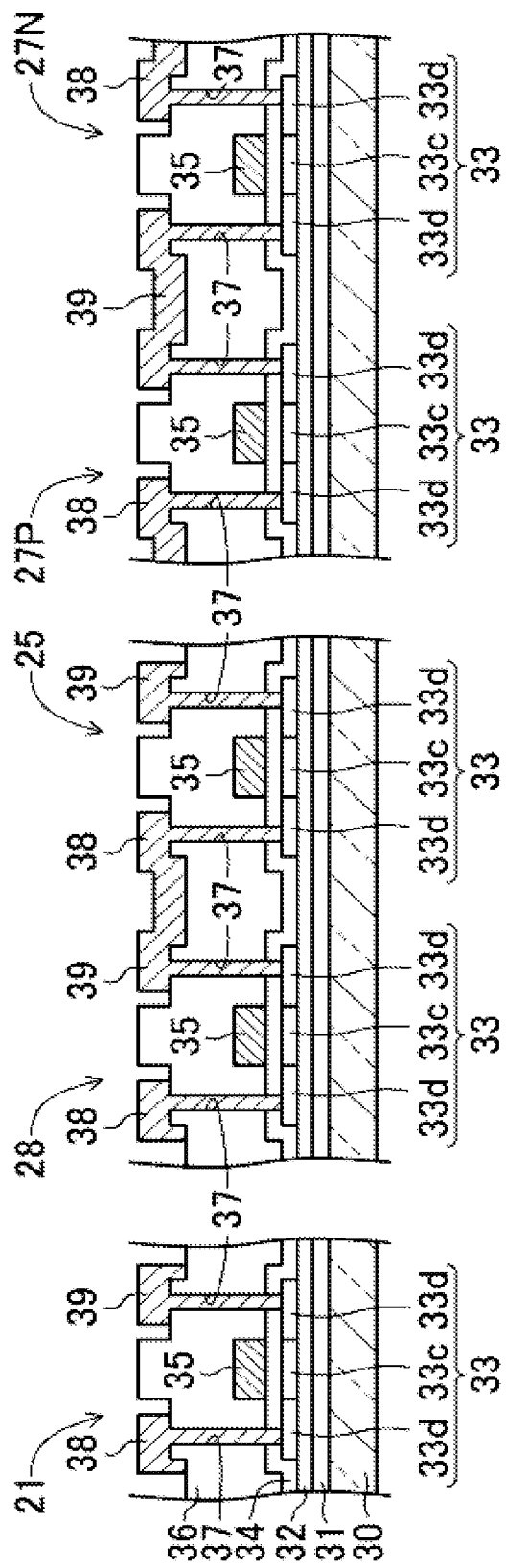
FIG. 17 shows cross-sectional views of sections corresponding to FIGS. 6 to 8, respectively, which illustrate a substrate after a source/drain forming process in the manufacturing method for a TFT substrate of Embodiment 1.
Figure 18:
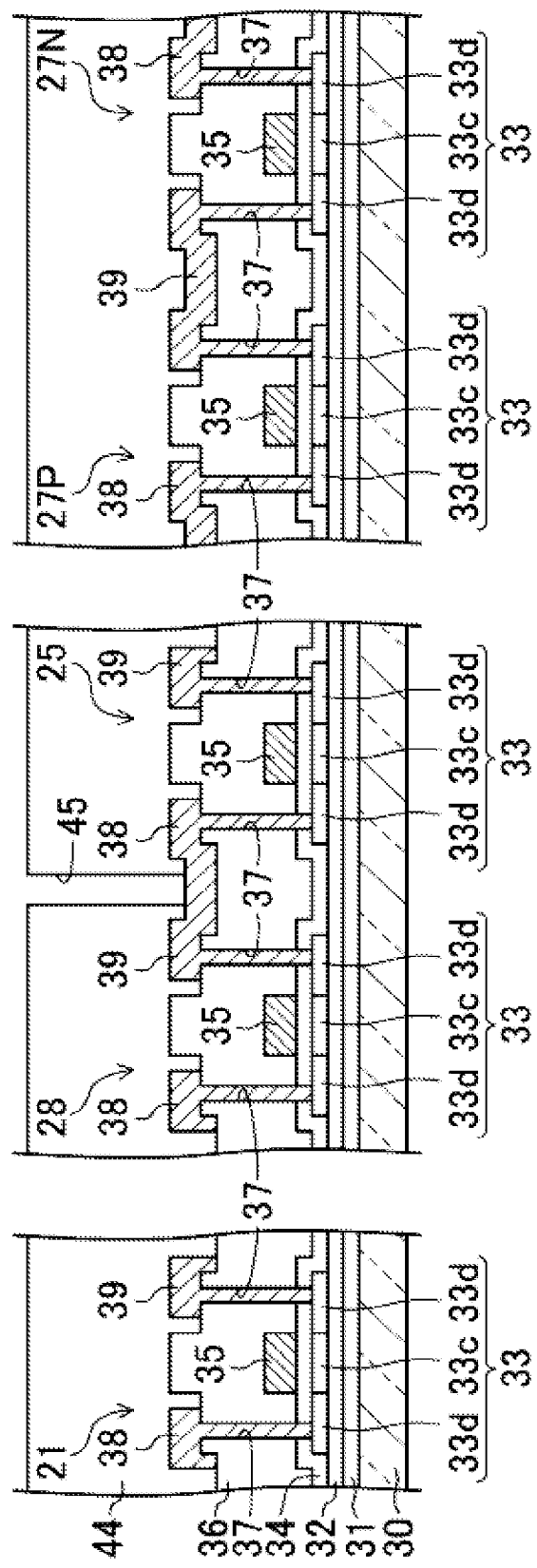
FIG. 18 shows cross-sectional views of sections corresponding to FIGS. 6 to 8, respectively, which illustrate a substrate after a second interlayer insulating film forming process in the manufacturing method for a TFT substrate of Embodiment 1.

Next, an example of a method for manufacturing the TFT substrate 1 and the liquid crystal display device S will be explained with reference to FIGS. 11 to 18. FIGS. 11 to 18 are figures for illustrating a manufacturing method for the TFT substrate 1, and are cross-sectional views of respective sections corresponding to FIGS. 6, 7, and 8 from the left side of each figure. FIG. 11 shows a semiconductor layer forming process; FIG. 12 shows a gate insulating film forming process; FIG. 13 shows a first impurity doping process; FIG. 14 shows a gate electrode forming process; FIG. 15 shows a second impurity doping process; FIG. 16 shows a first interlayer insulating film forming process and a contact hole forming process; FIG. 17 shows a source/drain electrode forming process; and FIG. 18 shows a second interlayer insulating film forming process.

The manufacturing method for the liquid crystal display device S includes: a TFT substrate manufacturing process, an opposite substrate manufacturing process, a bonding process, and a mounting process.

<TFT Substrate Manufacturing Process>

The TFT substrate manufacturing process includes: a base film forming process; a semiconductor layer forming process; a gate insulating film forming process; a first impurity doping process; a gate electrode forming process; a second impurity doping process; a first interlayer insulating film forming process; a contact hole forming process; a source/drain electrode forming process; a second interlayer insulating film forming process; and a pixel electrode forming process.

<Base Film Forming Process>

On an insulating substrate 30 such as a glass substrate prepared separately, a silicon nitride film 31 and a silicon oxide film 32 are formed in this order as base films by the chemical vapor deposition (referred to as CVD below) method.

<Semiconductor Layer Forming Process>

On the substrate having the base films 31 and 32 formed thereon, an amorphous silicon film is deposited by the LPCVD (low pressure CVD) method. Subsequently, by radiating a laser beam such as excimer laser or YAG laser to the amorphous silicon film, the amorphous silicon film is crystallized, thereby forming a crystalline silicon film 60 shown in FIG. 11(a). Next, by patterning the crystalline silicon film 60 by photolithography using a first photomask, as shown in FIG. 11(b), semiconductor layers 33 for the respective TFTs 21, 25, 27N, 27P and 28 are formed. At the same time, lower electrodes 22l and 26l of the respective capacitance elements 22 and 26 are formed. In this embodiment, at this point, the energy level of each semiconductor layer 33 is a donor level as a result of being affected by the base films 31 and 32.

The crystalline silicon film 60 was formed by crystallizing an amorphous silicon film by laser radiation, but the present invention is not limited thereto. The crystalline silicon film 60 may be formed by the epitaxial growth method in which an amorphous silicon film is crystallized by conducting heat treatment on the amorphous silicon film after adding a metal element such as nickel (Ni) as a catalyst element that promotes crystallization to the amorphous silicon film, or the crystalline silicon film 60 may be formed by other known methods.

<Gate Insulating Film Forming Process>

As shown in FIG. 12, on the substrate having the semiconductor layers 33 formed thereon, a silicon oxide film is deposited by the CVD method, thereby forming a gate insulating film 34.

<First Impurity Doping Process>

The first impurity doping process of the present embodiment includes an all layer doping step, a same type layer doping step, and an adjustment doping step.

<All Layer Doping Step>

As shown in FIG. 13(a), all of the semiconductor layers 33 covered by the gate insulating film 34 are doped with a p-type impurity such as boron (B).

<Same Type Layer Doping Step>

As shown in FIG. 13(b), after the all layer doping step, a resist pattern 61 for same type layer doping is formed by using a second photomask on the gate insulating film in regions overlapping the semiconductor layers 33 of the p-type TFTs 27P and 28, out of a plurality of semiconductor layers 33. Thereafter, using the resist pattern 61 for same type layer doping as a mask, a p-type impurity such as boron (B) is doped into semiconductor layers 33 of the n-type TFTs 21, 25, and 27N. Next, the resist pattern 61 for same type layer doping is removed by a resist remover, ashing, or the like.

<Adjustment Doping Step>

As shown in FIG. 13(c), after the same type layer doping step, a resist pattern 62 for adjustment doping is formed by using a third photomask on the gate insulating film in regions overlapping semiconductor layers 33 except for the semiconductor layer 33 of the n-type TFT 27N of the inverter circuit 27, out of the plurality of semiconductor layers 33. Thereafter, using the resist pattern 62 for adjustment doping as a mask, a p-type impurity such as boron (B) is doped only into the semiconductor layer 33 of the n-type TFT 27N of the inverter circuit 27. Next, the resist pattern 62 for adjustment doping is removed by a resist remover, ashing, or the like.

With the above-mentioned steps, it is possible to ensure that the semiconductor layer 33 of the n-type TFT 27N in the inverter circuit 27 is doped with a greater amount of a p-type impurity than semiconductor layers 33 of other n-type TFTs 21 and 25. Therefore, the depth of the acceptor level in the semiconductor layer 33 of the n-type TFT 27N in the inverter circuit 27 and the depth of the acceptor level in semiconductor layers 33 of other n-type TFTs 21 and 25 can be separately adjusted. The semiconductor layers 33 of the p-type TFTs 27P and 28 are adjusted to have donor levels at depths similar to each other. As a result, each semiconductor layer 33 is adjusted to an impurity level of each channel region 33c, which will be later formed.

In the present embodiment, the impurity doping process includes the all layer doping step, the same type layer doping step, and the adjustment doping step in this order, but the present invention is not limited thereto. That is, the all layer doping step, the same type layer doping step, and the adjustment doping step may be conducted in any order. Also, the all-layer doping step and the same type layer doping step are not necessary, and may be conducted as needed in consideration of the depths of donor levels in the respective semiconductor layers 33.

<Gate Electrode Forming Process>

On the substrate having the semiconductor layers 33 with adjusted impurity levels, an aluminum film, a titanium film, or a layered film thereof, for example, is formed as a conductive film, and the conductive film is patterned by photolithography using a fourth photomask. As a result, as shown in FIG. 14, gate electrodes 35 are formed on the gate insulating film 34 so as to overlap respective regions where channel regions are to be formed in the respective semiconductor layers 33. At the same time, the gate wiring lines 15, the storage capacitance wiring lines 16 (upper electrodes 22u and 26u), the input/output control wiring lines 17, and the high power wiring lines 18 are also formed. This way, the pixel potential capacitance element 22 and the memory capacitance element 26 are constructed.

<Second Impurity Doping Process>

On the substrate having the gate electrodes 35 formed thereon, first, a resist pattern 63 for p-type layer doping is formed by using a fifth photomask on the gate insulating film in regions overlapping semiconductor layers of the n-type TFTs 21, 25, and 27N, and as shown in FIG. 15(a), using the resist pattern 63 for p-type layer doping and the gate electrodes 35 as masks, a p-type impurity such as boron (B) is doped into semiconductor layers 33 of the p-type TFTs 27P and 28 at a high concentration. As a result, in each of the semiconductor layers 33 of the p-type TFTs 27P and 28, a pair of high concentration impurity regions 33d and a channel region 33c are formed. Thereafter, the resist pattern 63 for p-type layer doping is removed by a resist remover, ashing, or the like.

Next, a resist pattern 64 for n-type layer doping is formed by using a sixth photomask on the gate insulating film in regions overlapping the semiconductor layers 33 of the p-type TFTs 27P and 28, and as shown in FIG. 15(b), using the resist pattern 64 for n-type layer doping and the gate electrodes 35 as masks, an n-type impurity such as phosphorus (P) is doped into semiconductor layers 33 of the n-type TFTs 21, 25, and 27N at a high concentration. As a result, in each of the semiconductor layers 33 of the n-type TFTs 21, 25, and 27N, a pair of high concentration impurity regions 33*d* and a channel region 33*c* are formed. Thereafter, the resist pattern 64 for n-type layer doping is removed by a resist remover, ashing, or the like.

In the present embodiment, an n-type impurity was doped into the semiconductor layers 33 of the n-type TFTs 21, 25, and 27N at a high concentration after doping a p-type impurity into the semiconductor layers 33 of the p-type TFTs 27P and 28 at a high concentration. However, the present invention is not limited thereto, and a p-type impurity may be doped into the semiconductor layers 33 of the p-type TFTs 27P and 28 at a high concentration after doping an n-type impurity into the semiconductor layers 33 of the n-type TFTs 21, 25, and 27N at a high concentration.

<First Interlayer Insulating Film Forming Process>

On the substrate with semiconductor layers 33 each having the pair of high concentration impurity regions 33*d* and the channel region 33*c*, a silicon nitride film and a silicon oxide film are formed in this order by the CVD method, thereby forming a first interlayer insulating film 36 shown in FIG. 16(*a*), which is a layered film of the silicon nitride film and the silicon oxide film.

<Contact Hole Forming Process>

By patterning the first interlayer insulating film 36 and the gate insulating film 34 by photolithography using a seventh mask, as shown in FIG. 16(*b*), contact holes 37 that respectively reach a pair of high concentration impurity regions 33*d* in each semiconductor layer 33 are formed in the two insulating films 34 and 36.

<Source/Drain Electrode Forming Process>

On the first interlayer insulating film 36 having the contact holes 37 formed therein, a titanium film, an aluminum film, a molybdenum nitride film, or a layered film thereof, for example, is formed as a conductive film, and by patterning the conductive film by photolithography using an eighth photomask, source electrodes 38 and drain electrodes 39 are formed as shown in FIG. 17. This way, the drive control TFT 21, the input control TFT 25, the inverter circuit 27 (n-type TFT 27N and p-type TFT 27P), and the output control TFT 28 are constructed. At the same time, the source wiring lines 19 and the first to third connecting wiring lines 40, 41, and 42 are also formed.

<Second Interlayer Insulating Film Forming Process>

The substrate having the TFTs 21, 25, 27N, 27P, and 28 and the capacitance elements 22 and 26 formed thereon is coated with an insulating film made of a resin by spin coating or slit coating, and the coating film is patterned by conducting an exposure process using a ninth photomask and a development process. As a result, as shown in FIG. 18, a second interlayer insulating film 44 having a contact hole 45 is formed.

<Pixel Electrode Forming Process>

On the substrate having the second interlayer insulating film 44 formed thereon, a transparent conductive film is formed of indium tin oxide (referred to as ITO below), for example, by sputtering, and by patterning the transparent conductive film by photolithography using a tenth photomask, respective pixel electrodes 23 are formed.

The TFT substrate 1 can be manufactured in the above-mentioned manner.

<Opposite Substrate Manufacturing Process>

First, an insulating substrate such as a glass substrate is coated with a photosensitive resin colored in black, for example, by spin coating or slit coating, and the coating film is patterned by conducting an exposure process using a photomask and a development process. As a result, a black matrix is formed.

Next, on the substrate having the black matrix formed thereon, a negative type acrylic photosensitive resin colored in red, green, or blue, for example, is applied, and by patterning the applied resin film through an exposure process using a photomask and a development process, colored layers of a selected color (red layers, for example) are formed. Similar processes are repeated to form colored layers of other two colors (green layers and blue layers, for example), thereby forming color filters of all colors.

Next, on the substrate having color filters formed thereon, a common electrode 50 is formed by depositing an ITO film, for example, by sputtering. Thereafter, the substrate having the common electrode 50 formed thereon is coated with a positive type phenol novolac photosensitive resin by spin coating or slit coating, and by patterning the coating film through an exposure process using a photomask and a development process, photospacers are formed.

The opposite substrate 2 can be manufactured in the above-mentioned manner.

<Bonding Process>

First, a surface of the TFT substrate 1 is coated with a polyimide resin by a printing method. Thereafter, a baking process and a rubbing process are conducted on the coating film, thereby forming an alignment film 5. In a manner similar to the TFT substrate 1, an alignment film 6 is formed on a surface of the opposite substrate 2.

Next, by using a dispenser or the like, a sealing member 3 made of a UV-setting and thermosetting resin or the like is formed in a rectangular frame shape on the surface of the opposite substrate 2 on which the alignment film 6 is provided. Next, a prescribed amount of liquid crystal material is dropped onto a region inside the sealing member 3 of the opposite substrate 2.

After the opposite substrate 2 having the liquid crystal material dropped thereon and the TFT substrate 1 having the alignment film 5 formed thereon are stacked under a reduced pressure, the stacked substrates are released to an atmospheric pressure, thereby applying a pressure to the surfaces of the stacked substrates. Then, after radiating UV (ultraviolet) light to the sealing member 3 of the stacked substrates to temporarily cure the sealing material 3, heat treatment is conducted on the stacked substrates to cure the sealing material 3, thereby bonding the TFT substrate 1 and the opposite substrate 2 to each other.

Thereafter, on the respective surfaces of the bonded substrates, in other words, on the respective outer surfaces of the TFT substrate 1 and the opposite substrate 2 bonded to each other, polarizing plates 7 and 8 are respectively disposed.

<Mounting Process>

In the terminal region 1*a* in the bonded substrates having the polarizing plates 7 and 8 provided on the respective surfaces thereof, ACFs are disposed, and thereafter, integrated circuit chips and wiring boards are mounted onto the terminal region 1*a* of the bonded substrates by thermal-bonding through the ACFs.

The liquid crystal display device S can be manufactured through the above-mentioned processes.

Effects of Embodiment 1

According to Embodiment 1, the absolute value of the threshold voltage in the n-type TFT 27N of the inverter circuit 27 in each sub-pixel p1 is greater than the absolute value of the threshold voltage of other n-type TFTs 21 and 25. Therefore, it is possible to prevent the n-type TFT 27N of the inverter circuit 27 from being turned on when it needs to stay off, and as a result, an erroneous operation of the inverter circuit 27 can be prevented. The threshold voltages of the n-type TFT 27N of the inverter circuit 27 and the other n-type TFTs 21 and 25 are separately controlled by making the concentrations of a p-type impurity in the respective channel regions 33c differ from each other. Therefore, an erroneous operation in the other n-type TFTs 21 and 25 does not occur even though the absolute value of the threshold voltage of the n-type TFT 27N of the inverter circuit 27 is increased. As a result, erroneous operations in the inverter circuit 27 that controls the refresh operation and in other TFTs 21 and 25 can be prevented, and a normal binary memory display can be reliably performed. This makes it possible to achieve a reduction in power consumption without causing degradation of the display quality.

Modification Example of Embodiment 1

Figure 19:
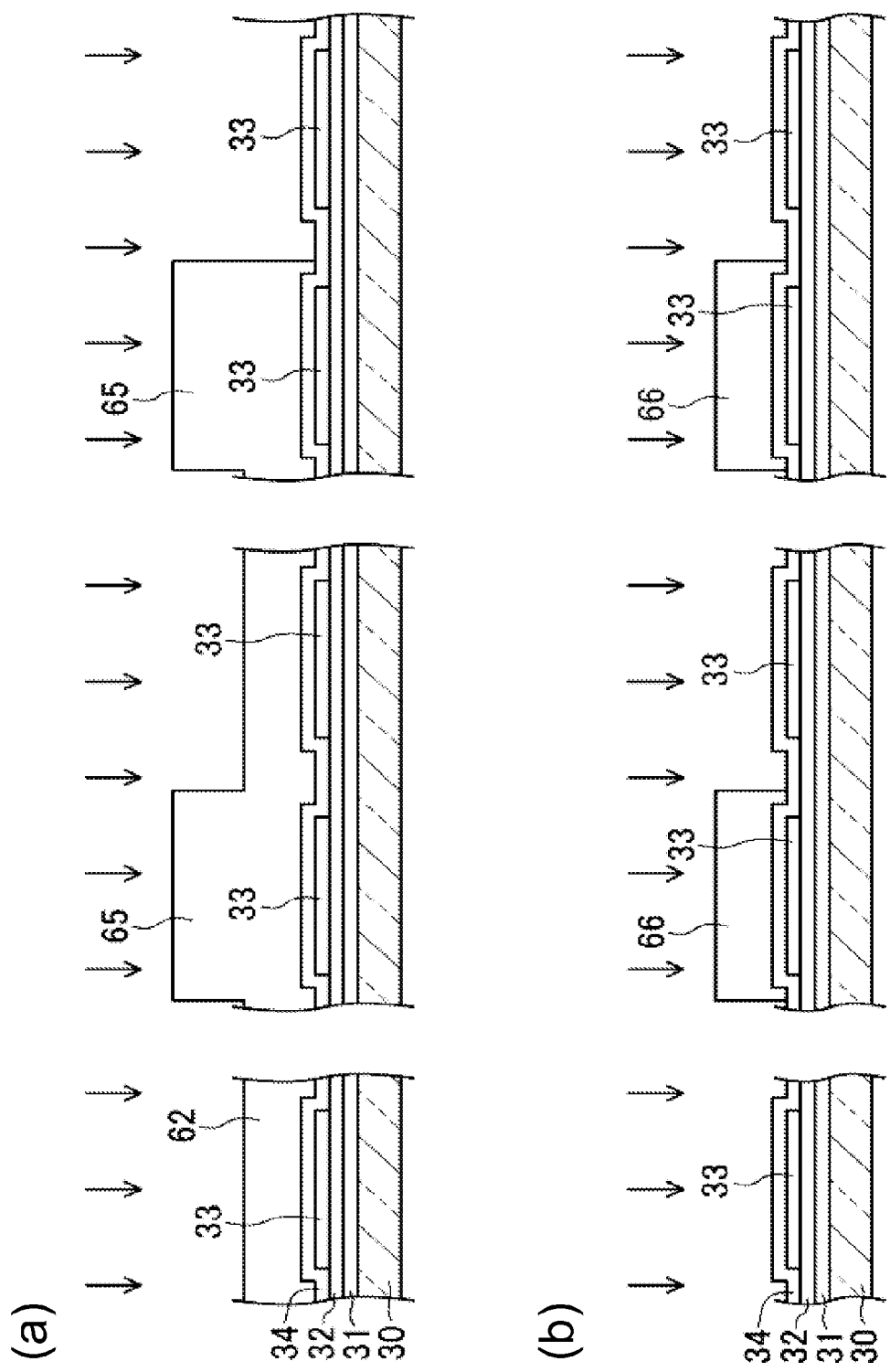
FIG. 19 shows cross-sectional views of sections corresponding to FIGS. 6 to 8, respectively, which illustrate the first impurity doping process in a manufacturing method for a TFT substrate of Modification Example of Embodiment 1.

FIG. 19 shows cross-sectional views of sections corresponding to FIGS. 6 to 8, respectively, which illustrate the first impurity doping process in a manufacturing method for the TFT substrate 1 of Modification Example. FIG. 19(a) shows an adjustment doping step, and FIG. 19(b) shows a same type layer doping step, respectively.

In Embodiment 1, in the first impurity doping process, the resist pattern 61 for same type layer doping was formed by using the second photomask, and the resist pattern 62 for adjustment doping was formed by using the third photomask, but in the Modification Example, the resist pattern for same type layer doping and the resist pattern for adjustment doping are formed by using a single photomask.

In the first impurity doping process of the Modification Example, the all layer doping step, the adjustment doping step, and the same type layer doping step are conducted in this order. The all layer doping step is conducted in a manner similar to Embodiment 1, and therefore, the description thereof is omitted.

<Adjustment Doping Step>

As shown in FIG. 19(a), a resist pattern 65 for adjustment doping is formed on the gate insulating film in regions overlapping semiconductor layers 33 except for the semiconductor layer 33 of the n-type TFT 27N of the inverter circuit 27, out of a plurality of semiconductor layers 33, by using a half-tone mask or gray-tone mask (multi-tone mask) as a second photomask such that portions overlapping the semiconductor layers 33 of the p-type TFTs 27P and 28 are made thicker than other portions. Thereafter, using the resist pattern 65 for adjustment doping as a mask, a p-type impurity such as boron (B) is doped only into the semiconductor layer 33 of the n-type TFT 27N of the inverter circuit 27.

<Same Type Layer Doping Step>

A resist pattern 66 for same type layer doping is formed by thinning the resist pattern 65 for adjustment doping by ashing, such that the resist pattern is left only in the regions overlapping the semiconductor layers 33 of the p-type TFTs 27P and 28. Thereafter, using the resist pattern 66 for same type layer doping as a mask, a p-type impurity such as boron (B) is doped into semiconductor layers 33 of n-type TFTs. Next, the resist pattern 66 for same type layer doping is removed by a resist remover or ashing.

Effects of Modification Example of Embodiment 1

According to the Modification Example, the two resist patterns 65 and 66 can be formed by using a single photomask. That is, the resist pattern 65 for adjustment doping and the resist pattern 66 for same type layer doping can be formed by using a single multi-tone mask, and therefore, it is possible to reduce the number of photomasks. As a result, a manufacturing cost of the TFT substrate 1 and the liquid crystal display device S can be reduced.

Embodiment 2

Figure 20:
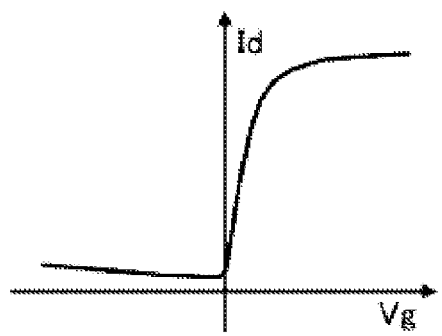
FIG. 20 shows graphs for current-voltage characteristics of respective TFTs of Embodiment 2.
Figure 20:
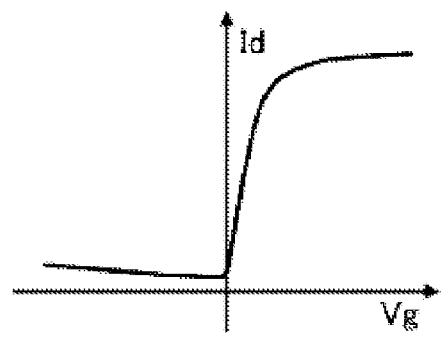
Figure 20:
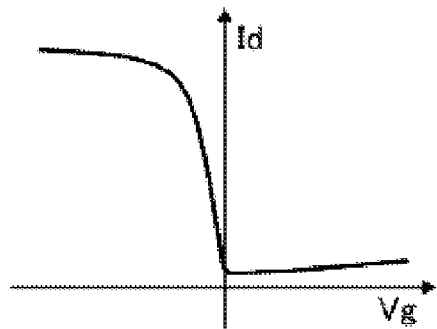
Figure 20:
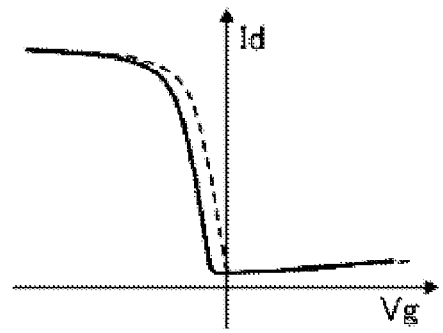

FIG. 20 shows graphs for current-voltage characteristics of respective TFTs 21, 25, 27N, 27P, and 28 of Embodiment 2. FIGS. 20(a) to 20(d) respectively correspond to FIGS. 9(a) to 9(d).

The present embodiment has configurations similar to those of Embodiment 1 above except for configurations of the n-type TFT 27N and the p-type TFT 27P of the inverter circuit 27 in each sub-pixel p1. Therefore, only the n-type TFT 27N and the p-type TFT 27P of the inverter circuit 27 having different configurations will be explained. In the embodiments below, the same configurations as those in FIGS. 1 to 19 are given the same reference characters and the same descriptions are applied as those in the embodiment above, and the detailed descriptions thereof are omitted.

As shown in FIGS. 20(a) and 20(b), the current-voltage characteristics of the n-type TFT 27N of the inverter circuit 27 in the present embodiment are the same as those of other n-type TFTs such as the drive control TFT 21 and the input control TFT 25. In the p-type TFT 27P of the inverter circuit 27, the concentration of a p-type impurity (boron, for example) that generates an acceptor level, which is an energy level having the opposite polarity to the donor level in the channel region 33c, is lower than the concentration of the p-type impurity in channel regions 33c of other p-type TFTs such as the output control TFT 28. As a result, as shown in FIGS. 20(c) and 20(d), in the p-type TFT 27P of the inverter circuit 27, the absolute value of the threshold voltage thereof is made greater by about 0.5V, for example, than that of the p-type TFT 28, which is the other p-type TFT.

—Manufacturing Method—

Figure 21:
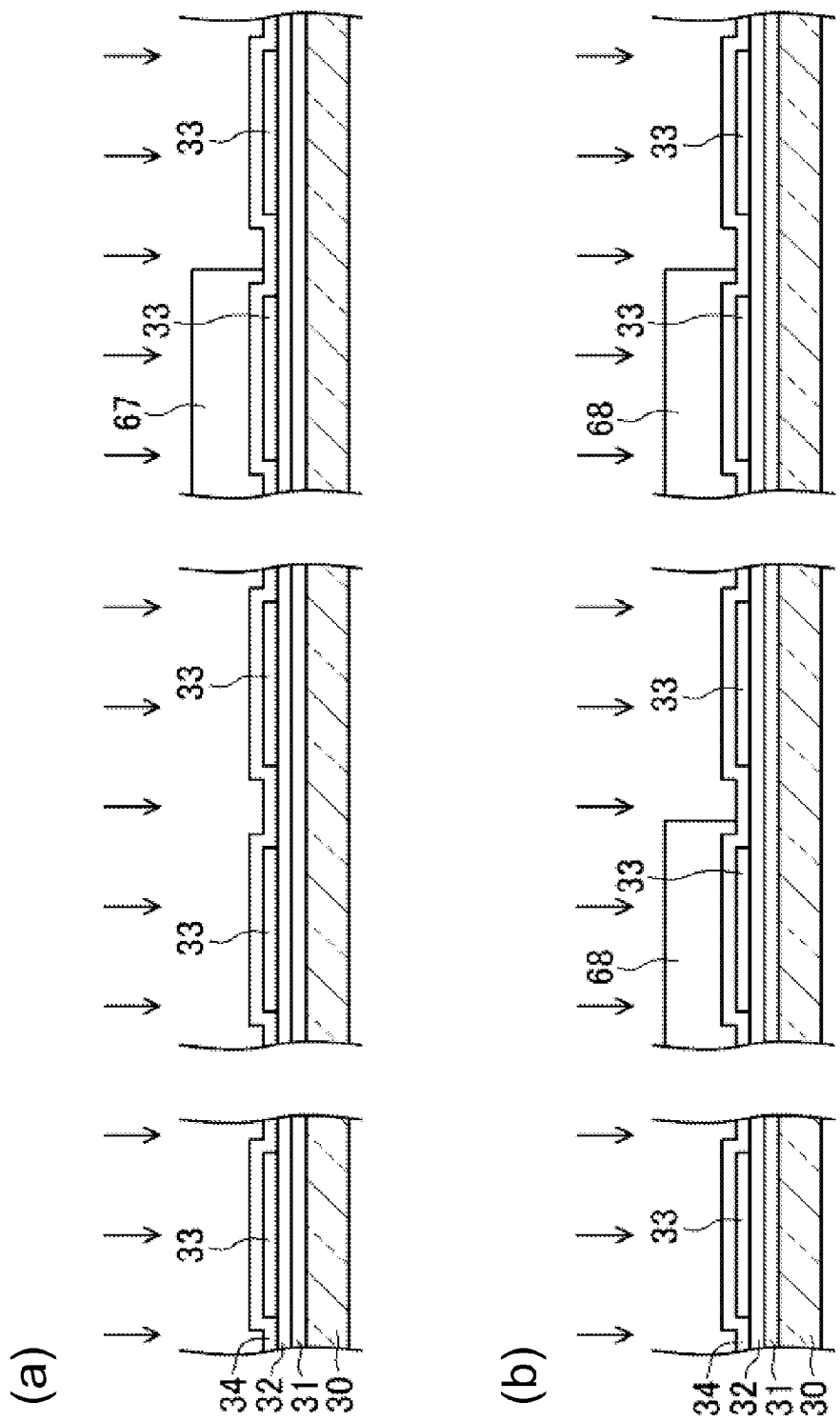
FIG. 21 shows cross-sectional views of sections corresponding to FIGS. 6 to 8, respectively, which illustrate the first impurity doping process of Embodiment 2.

An example of the manufacturing method for the TFT substrate 1 equipped with the inverter circuit 27 of the present embodiment will be explained with reference to FIG. 21. FIG. 21 shows cross-sectional views of sections corresponding to FIGS. 6 to 8, respectively, which illustrate the first impurity doping process in the present embodiment.

The TFT substrate manufacturing process of the present embodiment also includes a base film forming process, a semiconductor layer forming process, a gate insulating film forming process, a first impurity doping process, a gate electrode forming process, a second impurity doping process, a first interlayer insulating film forming process, a contact hole forming process, a source/drain electrode forming process, a second interlayer insulating film forming process, and a pixel electrode forming process, but the respective processes other than the first impurity doping process are similar to those of Embodiment 1, and therefore, detailed descriptions thereof are omitted.

<First Impurity Doping Process>

The first impurity doping process of the present embodiment includes an all layer doping step, an adjustment doping step, and a same type layer doping step.

<All Layer Doping Step>

In a manner similar to Embodiment 1 above, all of the semiconductor layers 33 covered by the gate insulating film 34, which was formed in the gate insulating film forming process, are doped with a p-type impurity such as boron (B).

<Adjustment Doping step>

After the all layer doping step, as shown in FIG. 21(a), a resist pattern 67 for adjustment doping is formed by using a second photomask on the gate insulating film in a region overlapping a semiconductor layer 33 of the p-type TFT 27P of the inverter circuit 27, out of a plurality of semiconductor layers 33. Thereafter, using the resist pattern 67 for adjustment doping as a mask, a p-type impurity such as boron (B) is doped into semiconductor layers 33 except for the semiconductor layer 33 of the p-type TFT 27P of the inverter circuit 27. Next, the resist pattern 67 for adjustment doping is removed by a resist remover, ashing, or the like.

<Same Type Layer Doping Step>

As shown in FIG. 21(b), after the adjustment doping step, a resist pattern 68 for same type layer doping is formed by using a third photomask on the gate insulating film in regions overlapping with the semiconductor layers 33 of the p-type TFTs 27P and 28, out of a plurality of semiconductor layers 33. Thereafter, using the resist pattern 68 for same type layer doping as a mask, a p-type impurity such as boron (B) is doped into semiconductor layers 33 of the n-type TFTs 21, 25, and 27N. Next, the resist pattern 68 for same type layer doping is removed by a resist remover, ashing, or the like.

With the above-mentioned steps, it is possible to ensure that the semiconductor layer 33 of the p-type TFT 27P in the inverter circuit 27 is doped with a smaller amount of p-type impurity than that in the semiconductor layer 33 of the p-type TFT 28, which is the other p-type TFT, and the depth of the donor level in the semiconductor layer 33 of the p-type TFT 27P in the inverter circuit 27 can be adjusted separately from the depth of the donor level in the semiconductor layers 33 of the p-type TFT 28. The semiconductor layers of the n-type TFTs 21, 25, and 27N are adjusted to have acceptor levels similar to each other. As a result, each semiconductor layer 33 is adjusted to have an impurity level of each channel region 33c, which will be later formed.

In the present embodiment, the impurity doping process includes the all layer doping step, the adjustment doping step, and the same type layer doping step in this order, but the present invention is not limited thereto. That is, the all layer doping step, the adjustment doping step, and the same type layer doping step may be conducted in any order. Also, the all layer doping step and the same type layer doping step are not necessary, and may be conducted as needed in consideration of the depth of a donor level in each semiconductor layer 33.

Effects of Embodiment 2

According to Embodiment 2, the absolute value of the threshold voltage in the p-type TFT 27P of the inverter circuit 27 in each sub-pixel p1 is greater than the absolute value of the threshold voltage of the other p-type TFT 28. Therefore, it is possible to prevent the p-type TFT 27P of the inverter circuit 27 from being turned on when it needs to stay off, and as a result, an erroneous operation of the inverter circuit 27 can be prevented. The threshold voltages of the p-type TFT 27P of the inverter circuit 27 and the other p-type TFT 28 are separately controlled by making the concentrations of the p-type impurity in the respective channel regions 33c differ from each other. Therefore, an erroneous operation in the other p-type TFT 28 does not occur even though the absolute value of the threshold voltage of the p-type TFT 27P in the inverter circuit 27 is increased. As a result, erroneous operations in the inverter circuit 27 that controls the refresh operation and in the other TFT 28 can be prevented, and it is possible to perform a normal binary memory display reliably. This makes it possible to achieve a reduction in power consumption without causing degradation of the display quality.

Modification Example of Embodiment 2

Figure 22:
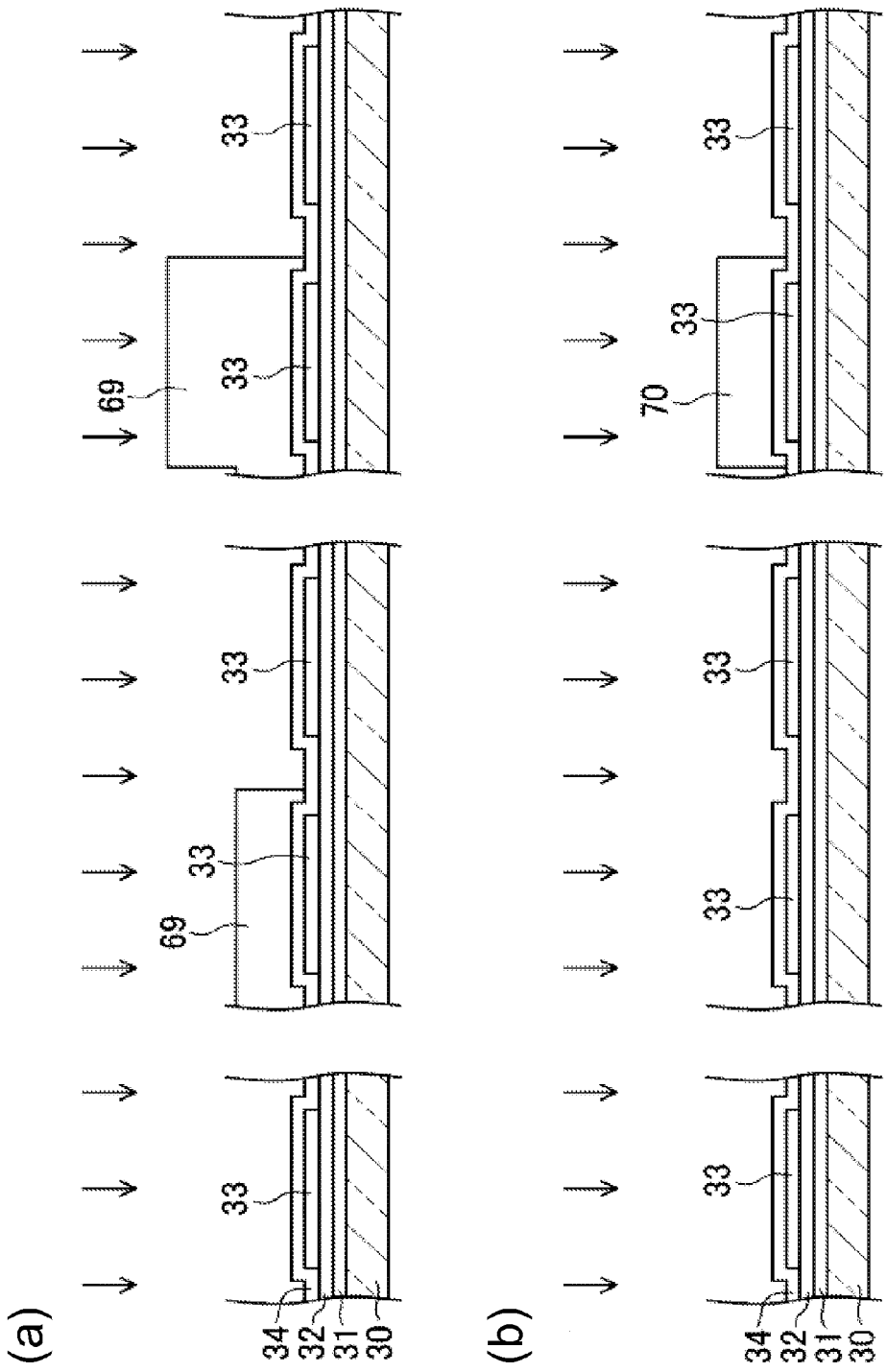
FIG. 22 shows cross-sectional views of sections corresponding to FIGS. 6 to 8, respectively, which illustrate the first impurity doping process of Modification Example of Embodiment 2.

FIG. 22 shows cross-sectional views of sections corresponding to FIGS. 6 to 8, respectively, which illustrate the first impurity doping process in a manufacturing method for the TFT substrate 1 of the Modification Example. FIG. 22(a) shows a same type layer doping step, and FIG. 22(b) shows an adjustment doping step, respectively.

In Embodiment 2, in the first impurity doping process, the resist pattern 67 for adjustment doping was formed by using the second photomask, and the resist pattern 68 for same type layer doping was formed by using the third photomask, but in the Modification Example, the resist pattern for adjustment doping and the resist pattern for same type layer doping are formed by using a single photomask.

In the first impurity doping process of the Modification Example, the all layer doping step, the same type layer doping step, and the adjustment doping step are conducted in this order. The all layer doping step is conducted in a manner similar to Embodiment 1, and therefore, the description thereof is omitted.

<Same Type Layer Doping Step>

As shown in FIG. 22(a), after the all layer doping step, a resist pattern 69 for same type layer doping is formed on the gate insulating film in regions overlapping semiconductor layers 33 of the p-type TFT 27P of the inverter circuit 27 and the p-type TFT 28, out of a plurality of semiconductor layers 33, by using a half-tone mask or gray-tone mask (multi-tone mask) as a second photomask such that a portion thereof overlapping the semiconductor layer 33 of the p-type TFT 27P of the inverter circuit 27 is made thicker than other portions. Thereafter, using the resist pattern 69 for same type layer doping as a mask, a p-type impurity such as boron (B) is doped into semiconductor layers 33 of the n-type TFTs 21, 25, and 27N. Next, the resist pattern 69 for same type layer doping is removed by a resist remover, ashing, or the like.

<Adjustment Doping Step>

As shown in FIG. 22(b), a resist pattern 70 for adjustment doping is formed by thinning the resist pattern 69 for same type layer doping by ashing, such that the resist pattern is left only in the region overlapping the semiconductor layer 33 of the p-type TFT 27P of the inverter circuit 27. Thereafter, using the resist pattern 70 for same type layer doping as a mask, a p-type impurity such as boron (B) is doped into semiconductor layers 33 except for the semiconductor layer 33 of the p-type TFT 27P of the inverter circuit 27. Next, the resist pattern 70 for adjustment doping is removed by a resist remover, ashing, or the like.

Effects of Modification Example of Embodiment 2

According to the Modification Example, the two resist patterns 69 and 70 can be formed by using a single photomask. That is, the resist pattern 69 for same type layer doping and the resist pattern 70 for adjustment doping can be made by a single multi-tone mask, and therefore, it is possible to reduce the number of photomasks. As a result, a manufacturing cost of the TFT substrate 1 and the liquid crystal display device S can be reduced.

Embodiment 3

Figure 23:
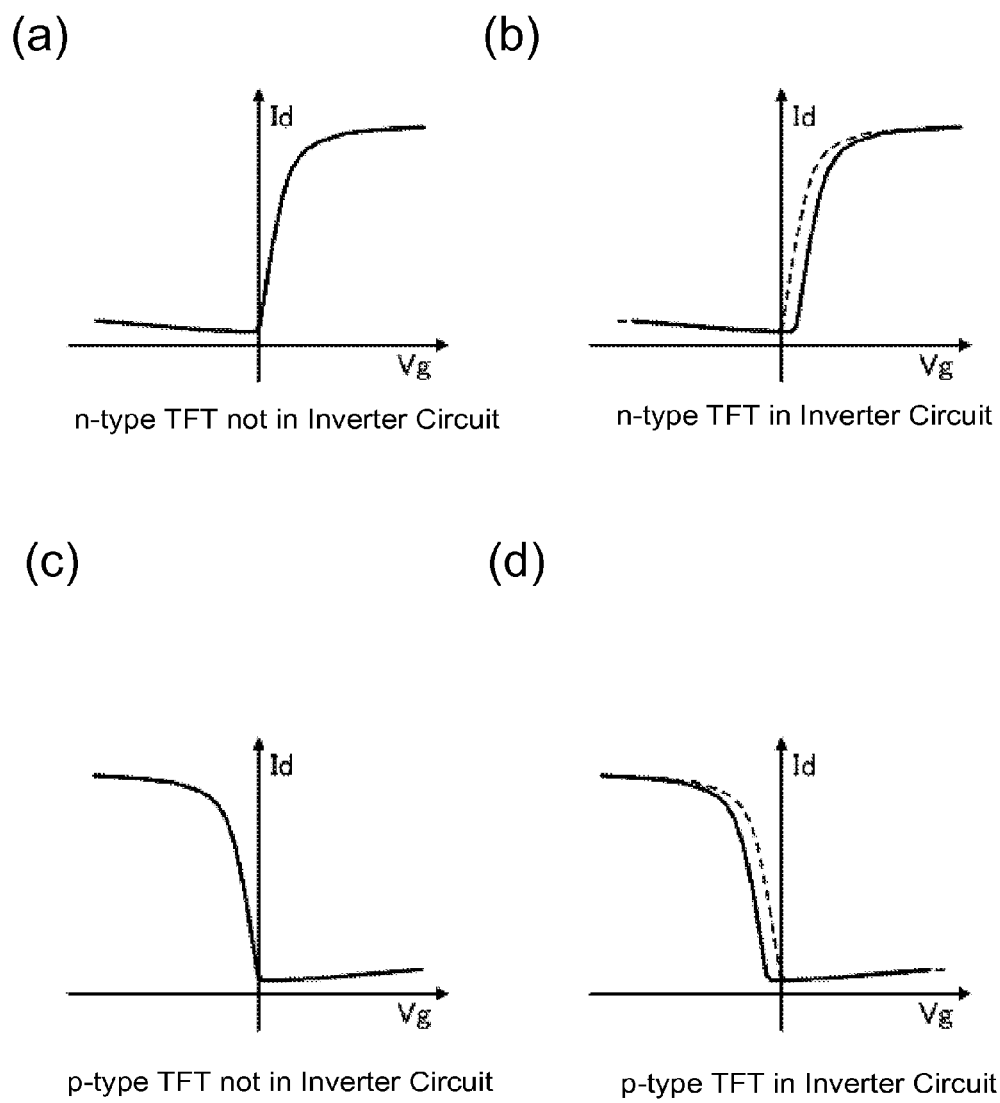
FIG. 23 shows graphs for current-voltage characteristics of respective TFTs of Embodiment 3.

FIG. 23 shows graphs for current-voltage characteristics of respective TFTs 21, 25, 27N, 27P, and 28 of Embodiment 3. FIGS. 23(a) to 23(d) respectively correspond to FIGS. 9(a) to 9(d).

In the n-type TFT 27N of the inverter circuit 27 of the present embodiment, the concentration of a p-type impurity (boron, for example) that generates an acceptor level in the channel region 33c is higher than the concentration of the p-type impurity in channel regions 33c of other n-type TFTs such as the drive control TFT 21 and the input control TFT 25. As a result, as shown in FIGS. 23(*a*) and 23(*b*), in the n-type TFT 27N of the inverter circuit 27, the absolute value of the threshold voltage thereof is made greater by about 0.5V, for example, than that of the other n-type TFTs 21 and 25. In the p-type TFT 27P of the inverter circuit 27, the concentration of the p-type impurity in the channel region 33*c* is lower than the concentration of the p-type impurity in the channel region 33*c* of the other p-type TFT 28. As a result, as shown in FIGS. 23(*c*) and 23(*d*), in the p-type TFT 27P of the inverter circuit 27, the absolute value of the threshold voltage thereof is made greater by about 0.5V, for example, than that of the other p-type TFT.

—Manufacturing Method—

Figure 24:
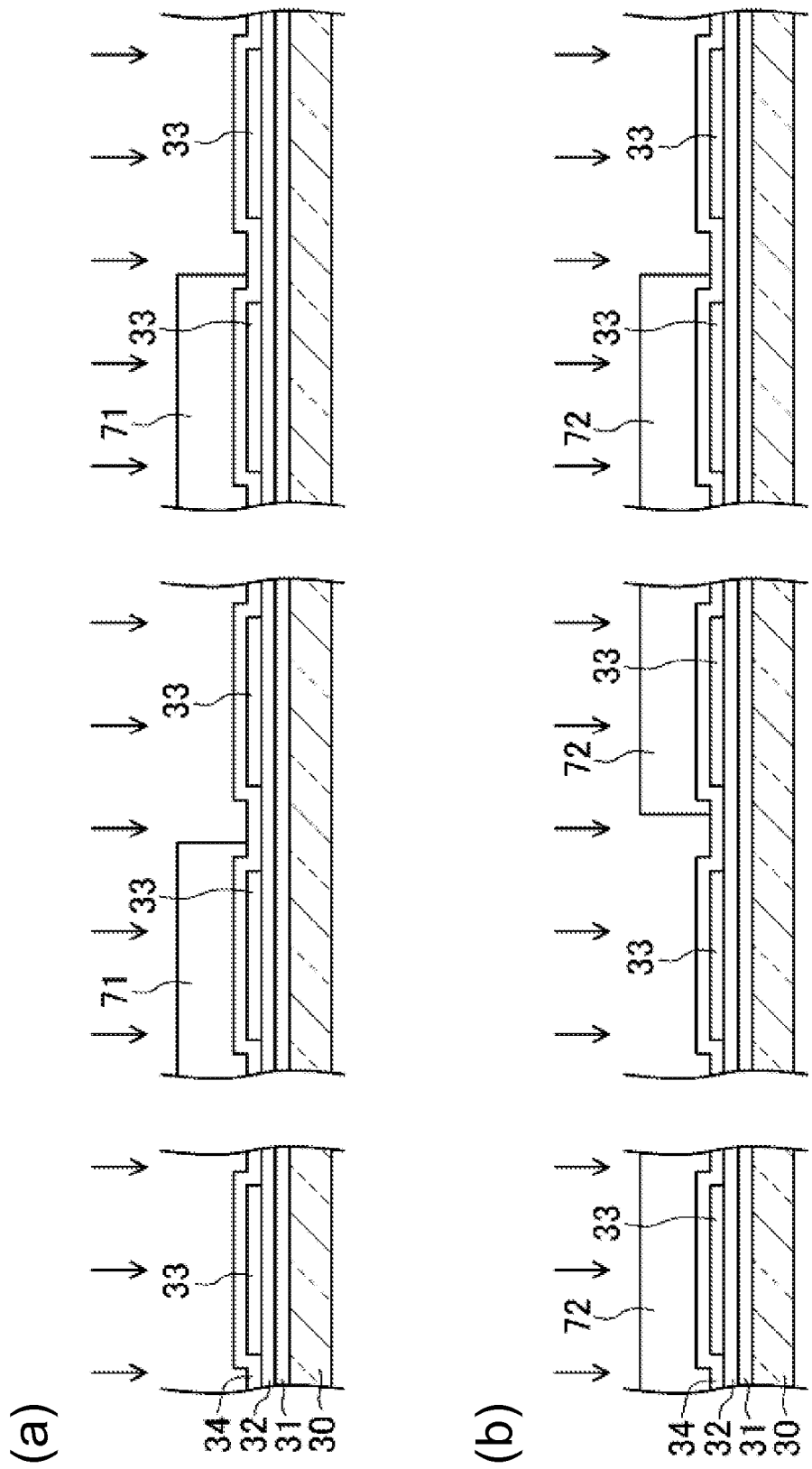
FIG. 24 shows cross-sectional views of sections corresponding to FIGS. 6 to 8, respectively, which illustrate the first impurity doping process of Embodiment 3.

An example of the manufacturing method for the TFT substrate 1 equipped with the inverter circuit 27 of the present embodiment will be explained with reference to FIG. 24. FIG. 24 shows cross-sectional views of sections corresponding to FIGS. 6 to 8, respectively, which illustrate the first impurity doping process in the present embodiment.

The TFT substrate manufacturing process of the present embodiment also includes a base film forming process, a semiconductor layer forming process, a gate insulating film forming process, a first impurity doping process, a gate electrode forming process, a second impurity doping process, a first interlayer insulating film forming process, a contact hole forming process, a source/drain electrode forming process, a second interlayer insulating film forming process, and a pixel electrode forming process, but the respective processes other than the first impurity doping process are similar to those of Embodiment 1, and therefore, detailed descriptions thereof are omitted.

<First Impurity Doping Process>

The first impurity doping process of the present embodiment includes an all layer doping step, a same type layer doping step, and an adjustment doping step.

<All Layer Doping Step>

In a manner similar to Embodiment 1 above, all of the semiconductor layers 33 covered by the gate insulating film 34 are doped with a p-type impurity such as boron (B).

<Same Type Layer Doping Step>

As shown in FIG. 24(*a*), after the all layer doping step, a resist pattern 71 for same type layer doping is formed by using a second photomask on the gate insulating film in regions overlapping semiconductor layers 33 of the p-type TFTs 27P and 28, out of a plurality of semiconductor layers 33. Thereafter, using the resist pattern 71 for same type layer doping as a mask, a p-type impurity such as boron (B) is doped into semiconductor layers 33 of the n-type TFTs 21, 25, and 27N. Next, the resist pattern 71 for same type layer doping is removed by a resist remover, ashing, or the like.

<Adjustment Doping Step>

As shown in FIG. 24(*b*), after the same type layer doping step, a resist pattern 72 for adjustment doping is formed by using a third photomask on the gate insulating film in regions overlapping semiconductor layers 33 of the n-type TFTs 21 and 25, which are other n-type TFTs than the n-type TFT 27N of the inverter circuit 27, and the semiconductor layer 33 of the p-type TFT 27P of the inverter circuit 27, out of a plurality of semiconductor layers 33. Thereafter, using the resist pattern 72 for adjustment doping as a mask, a p-type impurity such as boron (B) is doped into the semiconductor layer 33 of the n-type TFT 27N of the inverter circuit 27 and into the semiconductor layer 33 of the p-type TFT 28, which is the other p-type TFT than the p-type TFT 27P of the inverter circuit 27. Next, the resist pattern 72 for adjustment doping is removed by a resist remover, ashing, or the like.

With the above-mentioned steps, it is possible to ensure that a greater amount of a p-type impurity is doped in the semiconductor layer 33 of the n-type TFT 27N of the inverter circuit 27 than the semiconductor layers 33 of other n-type TFTs 21 and 25. As a result, the depth of the acceptor level in the semiconductor layer 33 of the n-type TFT 27N in the inverter circuit 27 is adjusted separately from the depth of the acceptor level in the semiconductor layers 33 of the other n-type TFTs 21 and 25. Also, it is possible to ensure that a smaller amount of a p-type impurity is doped in the semiconductor layer 33 of the p-type TFT 27P of the inverter circuit 27 than the semiconductor layer 33 of the other p-type TFT 28. As a result, the depth of the donor level in the semiconductor layer 33 of the p-type TFT 27P in the inverter circuit 27 is adjusted separately from the depth of the donor level in the semiconductor layer 33 of the other p-type TFT 28. This way, each semiconductor layer 33 is adjusted to have an impurity level of each channel region 33*c*, which will be later formed.

In the present embodiment, the impurity doping process includes the all layer doping step, the same type layer doping step, and the adjustment doping step in this order, but the present invention is not limited thereto. That is, the all layer doping step, the same type layer doping step, and the adjustment doping step may be conducted in any order. Also, the all layer doping step is not necessary, and may be conducted as needed in consideration of the depth of a donor level in each semiconductor layer 33.

Effects of Embodiment 3

According to Embodiment 3, the absolute values of the threshold voltages in both the n-type TFT 27N and the p-type TFT 27P of the inverter circuit 27 in each sub-pixel p1 are greater than the absolute values of the threshold voltages of the other TFTs 21, 25 and 28 of the respective same types. Therefore, it is possible to prevent the two TFTs 27N and 27P of the inverter circuit 27 from being turned on when they need to stay off, and as a result, an erroneous operation of the inverter circuit 27 can be prevented. The threshold voltages of the two TFTs 27N and 27P of the inverter circuit 27 and the other TFTs 21, 25, and 28 of the same types are separately controlled by making the concentrations of the p-type impurity in the respective channel regions 33*c* differ from each other. Therefore, an erroneous operation in the other TFTs 21, 25, and 28 of the same types does not occur even though the absolute values of the threshold voltages of the two TFTs 27N and 27P in the inverter circuit 27 are increased. As a result, erroneous operations in the inverter circuit 27 that controls the refresh operation and in other TFTs 21, 25, and 28 can be prevented, and it is possible to perform a normal binary memory display reliably. This makes it possible to achieve a reduction in power consumption without causing degradation of the display quality.

Embodiment 4

Figure 25:
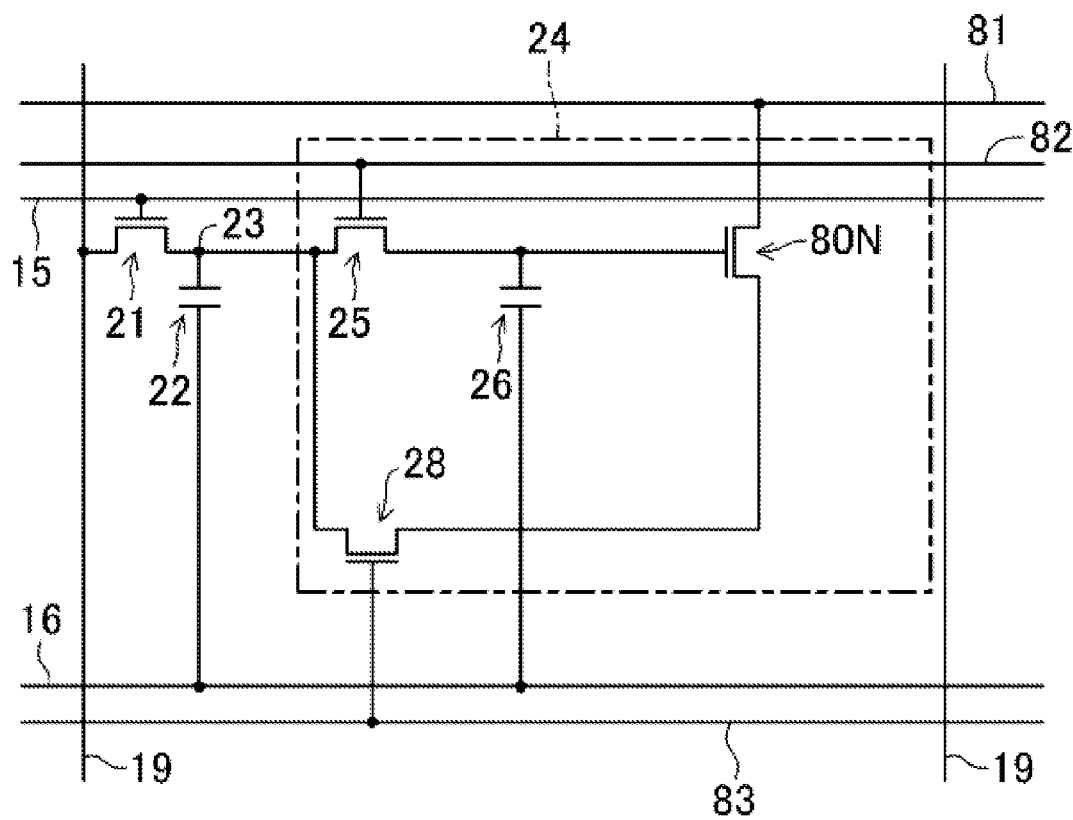
FIG. 25 is an equivalent circuit diagram of a sub-pixel of a TFT substrate of Embodiment 4.

FIG. 25 is an equivalent circuit diagram of a sub-pixel p1 of the TFT substrate of Embodiment 4.

In Embodiments 1 to 3 above, the configuration of the TFT substrate 1 in which the inverter circuit 27 is provided in the memory circuit 24 as a control circuit that controls the refresh operation, but the present invention is not limited to such. In the TFT substrate 1 of Embodiment 4, a control circuit of the memory circuit 24 is constituted of an operation control n-type TFT 80N, instead of the inverter circuit 27. In the operation control n-type TFT 80N, the gate is connected to the drain of the input control TFT 25, the source is connected to a low power wiring line 81, which is provided instead of the high power wiring line 18 in Embodiment 1, and the drain is connected to the source of the output control TFT 28.

In the present embodiment, not only the input control TFT 25, but also the output control TFT 28 is an n-type TFT. The gate of the input control TFT 25 is connected to an input control wiring line 82, and the gate of the output control TFT 28 is connected to an output control wiring line 83, respectively, which allows the input control TFT 25 and the output control TFT 28 to be driven separately.

In the operation control n-type TFT 80N, in a manner similar to the n-type TFT 27N of the inverter circuit 27 in Embodiment 1 above, the concentration of a p-type impurity (boron, for example) that generates an acceptor level in the channel region 33c is made higher than that of the p-type impurity in channel regions 33c of other n-type TFTs such as the drive control TFT 21, the input control TFT 25, and the output control TFT 28. As a result, the absolute value of the threshold voltage thereof is greater by about 0.5V, for example, than that of the other n-type TFTs 21, 25, and 28.

Figure 26:
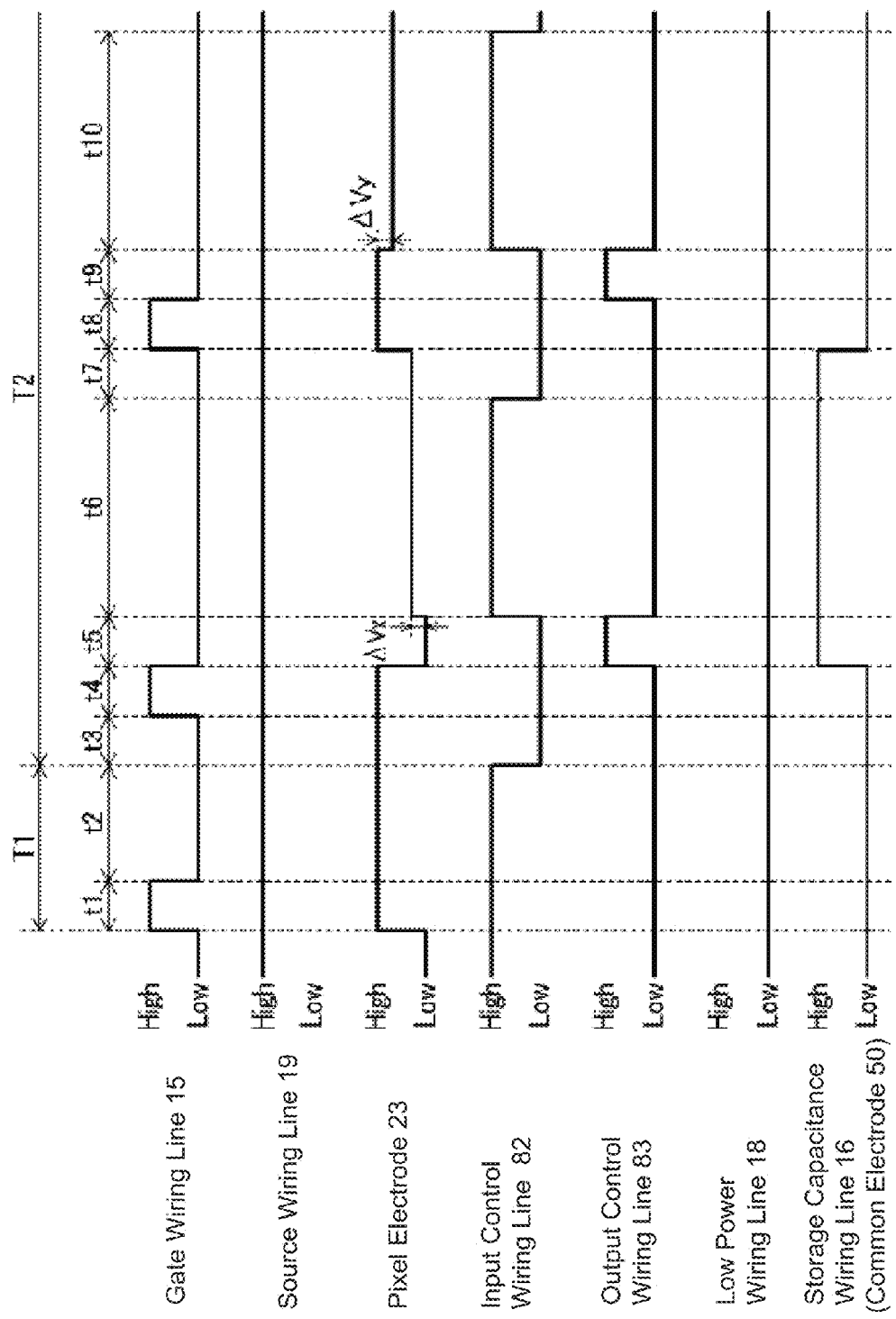
FIG. 26 is a timing chart of signal waveforms showing an operation of a binary memory display in the liquid crystal display device of Embodiment 4.

FIG. 26 is a timing chart of signal waveforms in a display operation by the binary memory display in the liquid crystal display device S provided with the TFT substrate 1.

In a manner similar to Embodiment 1 above, the writing period T1 in the display operation by the binary memory display scheme is made of successive two periods of a first period t1 and a second period t2.

In the first period t1, the potentials of the gate wiring line 15 and the input control wiring line 82 are both set to high level. The potential of the output control wiring line 83 is at low level. This turns on the drive control TFT 21 and the input control TFT 25, respectively, and as a result, electrical charges corresponding to the potential of the binary logic level (high, in this example) outputted to the source wiring line 19 are charged to the pixel potential capacitance element 22 and written into the pixel electrode 23 through the drive control TFT 21, and are also charged to the memory capacitance element 26 through the input control TFT 25.

In the subsequent second period t2, the potential of the gate wiring line 15 is set to low level. On the other hand, the potential of the input control wiring line 82 and the potential of the output control wiring line 83 are maintained at high and low levels, respectively. This turns the drive control TFT 21 off, and as a result, the pixel potential capacitance element 22, the pixel electrode 23, and the memory circuit 24 are electrically separated from the source wiring line 19. Because the input control TFT 25 remains on, the potential of the pixel potential capacitance element 22 is transferred to the memory capacitance element 26, and the potential of the memory capacitance element 26 becomes high.

Next, the refresh period T2 starts. The refresh period T2 of Embodiment 4 has third to tenth periods t3 to t10. During the refresh period T2, the potential of the source wiring line 19 is set to high level.

In the third period t3, the gate wiring line 15, the input control wiring line 82, and the output control wiring line 83 are set to low level. As a result, the pixel potential capacitance element 22 and the memory capacitance element 26 are separated from each other, and maintain a high potential, respectively.

In the fourth period t4, the potential of the gate wiring line 15 is set to high level. On the other hand, the potentials of the input control wiring line 82 and the output control wiring line 83 are maintained at low level. As a result, the drive control TFT 21 is turned on, and the high potential of the source wiring line 19 is written into the pixel potential capacitance element 22 and the pixel electrode 23 again.

In the fifth period t5, the potential of the gate wiring line 15 is set to low level, and the potential of the output control wiring line 83 is set to high level. On the other hand, the potential of the input control wiring line 82 remains at low level. This turns the drive control TFT 21 off, and as a result, the pixel potential capacitance element 22, the pixel electrode 23, and the memory circuit 24 are electrically separated from the source wiring line 19. The output control TFT 28 is turned on. The memory capacitance element 26 holds the high potential, and therefore, the operation control n-type TFT 80N is in the ON state. As a result, through the operation control n-type TFT 80N and the output control TFT 28, a low potential is outputted from the low power wiring line 81 to the pixel potential capacitance element 22 and the pixel electrode 23, and electrical charges corresponding to the potential are charged to the pixel potential capacitance element 22 and are written into the pixel electrode 23. This way, the potential of the pixel potential capacitance element 22 and the pixel electrode 23 is refreshed to low level.

In the sixth period t6, the potential of the input control wiring line 82 is set to high level, and the potential of the output control wiring line 83 is set to low level. On the other hand, the potential of the gate wiring line 15 remains at low level. As a result, the input control TFT 25 is turned on, and the potential of the pixel potential capacitance element 22 is transferred to the memory capacitance element 26, and the potentials of both of the pixel potential capacitance element 22 and the memory capacitance element 26 become low. The potential of the pixel electrode 23 is slightly increased by a voltage ΔVx by the electrical charges moving from the pixel potential capacitance element 22 to the memory capacitance element 26, but is still within the low potential range.

In the seventh period t7, the potential of the input control wiring line 82 is set to low level. The potentials of the gate wiring line 15 and the output control wiring line 83 are maintained at low level. As a result, the pixel potential capacitance element 22 and the memory capacitance element 26 are separated from each other, and maintain the low potential, respectively.

In the eighth period t8, the potential of the gate wiring line 15 is set to high level. On the other hand, the potentials of the input control wiring line 82 and the output control wiring line 83 are maintained at low level. As a result, the drive control TFT 21 is turned on, and the high potential of the source wiring line 19 is written into the pixel potential capacitance element 22 and the pixel electrode 23. This way, the potentials of the pixel potential capacitance element 22 and the pixel electrode 23 are refreshed to high level.

When this refresh operation is conducted, because the potential of the memory capacitance element 26 is low while the potential of the pixel potential capacitance element 22 is high, an off leak current would be generated in the input control TFT 25, and the potential of the memory capacitance element 26 is gradually increased to a high level over time. However, in the present embodiment, the absolute value of the threshold voltage in the operation control n-type TFT 80N is made relatively large, and therefore, even when the potential of the memory capacitance element 26 is increased slightly toward the high level, the operation control n-type TFT 80N is unlikely to be turned on, thereby preventing an erroneous operation.

In the ninth period t9, the potential of the gate wiring line 15 is set to low level, and the potential of the output control wiring line 83 is set to high level. On the other hand, the potential of the input control wiring line 82 remains at low level. This turns the drive control TFT 21 off, which causes the pixel potential capacitance element 22, the pixel electrode 23, and the memory circuit 24 to be electrically separated from the source wiring line 19. Also, the output control TFT 28 is turned on. Because the potential of the memory capacitance element 26 remains low, the operation control n-type TFT 80N is turned off, and the output of the low potential from the low power wiring line 81 is stopped.

In the tenth period t10, the potential of the input control wiring line 82 is set to high level, and the potential of the output control wiring line 83 is set to low level. On the other hand, the potential of the gate wiring line 15 is maintained at low level. As a result, the input control TFT 25 is turned on, and the potential of the pixel potential capacitance element 22 is transferred to the memory capacitance element 26, which causes the potentials of both of the pixel potential capacitance element 22 and the memory capacitance element 26 to be high. The potential of the pixel electrode 23 is decreased slightly by a voltage ΔVy by the electrical charges moving from the pixel potential capacitance element 22 to the memory capacitance element 26, but is still within a high potential range.

During the refresh period T2, the third to tenth periods t3 to t10 are repeated until the next writing period T1 starts. Even when a low potential is written into the pixel electrode 23 during the first period t1 of the writing period T1, the gate wiring line 15, the input control wiring line 82, and the output control wiring line 83 are applied with potentials having similar waveforms. The potential of the common electrode 50 is switched between high and low at the same time as when the potential of the pixel electrode 23 is refreshed. This way, a prescribed voltage is continuously applied to the liquid crystal layer 4 even while refreshing the data potential of the pixel electrode 23, and therefore, each sub-pixel p1 is maintained to be on or off, thereby making it possible to conduct multi-color display with eight (the cube of two) colors.

The TFT substrate 1 configured in the manner described above can be manufactured by forming the output control TFT 28 in a manner similar to the input control TFT 25 and forming the operation control n-type TFT 80N in a manner similar to the n-type TFT 27N of the inverter circuit 27 in Embodiment 1.

Effects of Embodiment 4

According to Embodiment 4, the absolute value of the threshold voltage of the operation control n-type TFT 80N in each sub-pixel p1 is made greater than the absolute value of the threshold voltage in other n-type TFTs 21, 25, and 28, and therefore, it is possible to prevent an erroneous operation in which the operation control n-type TFT 80N is turned on when it needs to stay off. Because the operation control n-type TFT 80N can be formed in a manner similar to the n-type TFT 27N of the inverter circuit 27 of Embodiment 1, it is possible to prevent erroneous operations in other n-type TFTs 21, 25, and 28 even though the absolute value of the threshold voltage of the operation control n-type TFT 80N is increased. As a result, erroneous operations in the operation control n-type TFT 80N that controls the refresh operation and in other n-type TFTs 21, 25, and 28 can be prevented, and it is possible to perform a normal binary memory display reliably. This makes it possible to achieve a reduction in power consumption without causing degradation of the display quality.

Modification Example of Embodiment 4

Figure 27:
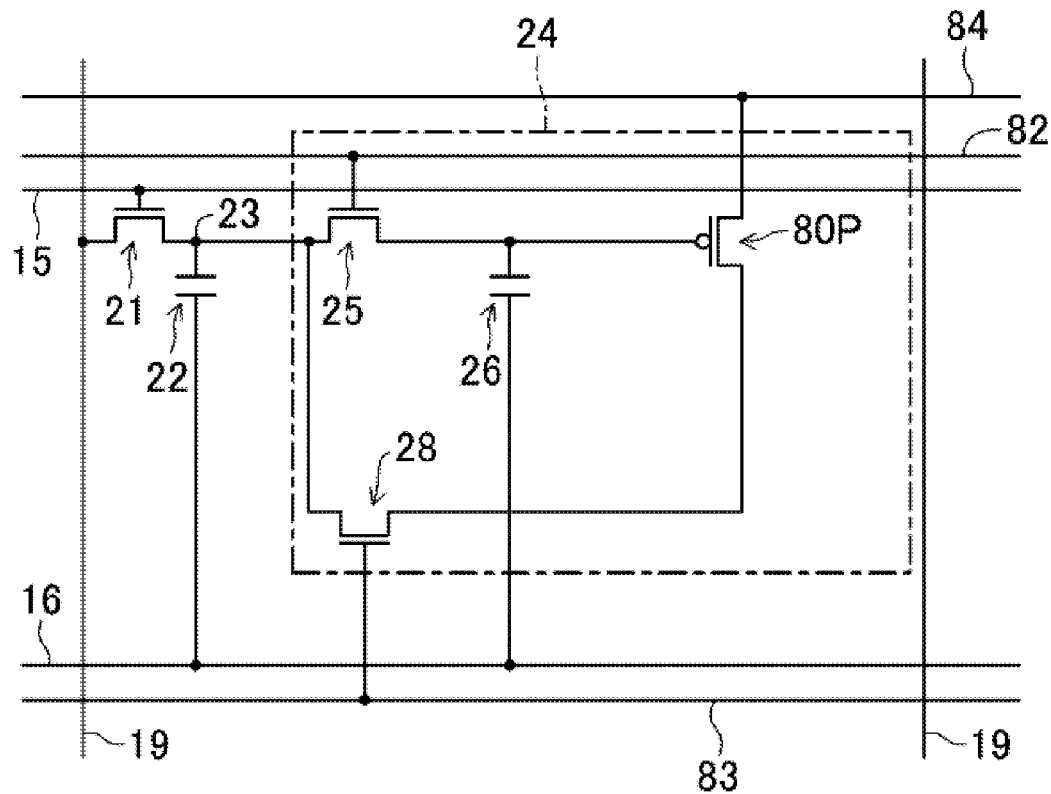
FIG. 27 is an equivalent circuit diagram of a sub-pixel of a TFT substrate of Modification Example of Embodiment 4.

FIG. 27 is an equivalent circuit diagram of a sub-pixel p1 of the TFT substrate 1 of Modification Example.

In Embodiment 4, the control circuit of the memory circuit 24 is constituted of the operation control n-type TFT 80N, but in the Modification Example, the control circuit of the memory circuit 24 is constituted of an operation control p-type TFT 80P, instead of the operation control n-type TFT 80N. The source of the operation control p-type TFT 80P is connected to a high power wiring line 84.

In the operation control p-type TFT 80P, in a manner similar to the p-type TFT 27P of the inverter circuit 27 in Embodiment 2, the concentration of a p-type impurity (boron, for example) in the channel region 33c thereof is made lower than that of the p-type impurity in channel regions 33 in not-shown other p-type TFTs, and the absolute value of the threshold voltage thereof is greater by about 0.5V, for example, than that of the other p-type TFTs.

In the display operation by the binary memory display scheme of the liquid crystal display device S equipped with the above-mentioned TFT substrate 1, in the refresh period T2, the potential of the source wiring line 19 is set to low level, and the gate wiring line 15, the input control wiring line 82, and the output control wiring line 83 are applied with potentials having waveforms similar to those in Embodiment 4.

The TFT substrate 1 having the above-mentioned configuration can be manufactured by forming the operation control p-type TFT 80P in a manner similar to the p-type TFT 27P of the inverter circuit 27 in Embodiment 2.

Effects of Modification Example of Embodiment 4

According to this Modification Example, the absolute value of the threshold voltage of the operation control p-type TFT 80P in each sub-pixel p1 is made greater than the absolute value of the threshold voltage of other p-type TFTs, and therefore, it is possible to prevent an erroneous operation in which the operation control p-type TFT 80P is turned on when it needs to stay off. Because the operation control p-type TFT 80P can be formed in a manner similar to the p-type TFT 27P of the inverter circuit 27 in Embodiment 2, it is possible to prevent erroneous operations in other p-type TFTs even though the absolute value of the threshold voltage of the operation control p-type TFT 80P is increased. As a result, erroneous operations in the operation control p-type TFT 80P that controls the refresh operation and in other p-type TFTs can be prevented, and it is possible to perform a normal binary memory display reliably. This makes it possible to achieve a reduction in power consumption without causing degradation of the display quality.

Other Embodiments

The following configurations can be employed in Embodiments 1 to 3 above.
<Configuration of TFT Substrate 1>
In Embodiment 1, the absolute value of the threshold voltage of the n-type TFT 27N in the inverter circuit 27 was made greater than the absolute value of the threshold voltage in other n-type TFTs 21 and 25, and the absolute value of the threshold voltage of the p-type TFT 27P in the inverter circuit 27 was the same as the absolute value of the threshold voltage of the other p-type TFT 28. However the present invention is not limited thereto, and the absolute value of the threshold voltage of the p-type TFT 27P in the inverter circuit 27 may be made greater than that of the other p-type TFT 28 by adjusting the concentration of an n-type impurity (phosphorus, for example) that generates a donor level in the channel region 33c in the p-type TFT 27P so as to be higher than the concentration of the n-type impurity in the channel region 33c in the other p-type TFT 28. In order to manufacture the TFT substrate 1 equipped with the inverter circuit 27 having such a configuration, it is necessary to add a step of doping an n-type impurity such as phosphorus (P) to the semiconductor layer 33 of the p-type TFT 27P in the inverter circuit 27 to the first impurity doping process.

In Embodiment 2, the absolute value of the threshold voltage of the p-type TFT 27P in the inverter circuit 27 was made greater than the absolute value of the threshold voltage of the other P-type TFT 28, and the absolute value of the threshold voltage of the n-type TFT 27N in the inverter circuit 27 was the same as the absolute value of the threshold voltage of other n-type TFTs 21 and 25. However, the present invention is not limited thereto, and the absolute value of the threshold voltage of the n-type TFT 27N in the inverter circuit 27 may be made greater than that of other n-type TFTs 21 and 25 by adjusting the concentration of an n-type impurity (phosphorus, for example) that generates a donor level having the opposite polarity to the acceptor level in the channel region 33c of the n-type TFT 27N so as to be lower than that of the n-type impurity in the channel regions 33c in other n-type TFTs 21 and 25. In order to manufacture the TFT substrate 1 equipped with the inverter circuit 27 having such a configuration, it is necessary to add a step of doping an n-type impurity such as phosphorus (P) to the semiconductor layers 33 of n-type TFTs 21, 25, and 27N to the first impurity doping process, and in that step, it is necessary to dope an n-type impurity into the semiconductor layer 33 of the n-type TFT 27N in the inverter circuit 27 with a smaller amount than the semiconductor layers 33 of other TFTs 21 and 25.

In Embodiment 2 above, in the first impurity doping process, the threshold voltages of the n-type TFT 27N of the inverter circuit 27 and of other n-type TFTs 21 and 25 may be separately adjusted by doping an n-type impurity only into the semiconductor layers 33 of other n-type TFT 21 and 25, and not to the semiconductor layer 33 of the n-type TFT 27N in the inverter circuit 27.

In Embodiments 1 to 3 above, an example in which the drive control TFT 21 and the input control TFT 25 were n-type TFTs, and the output control TFT 28 was a p-type TFT was described. However, the present invention is not limited thereto, and at least one of the drive control TFT 21 and the input control TFT 25 may be a p-type TFT, and the output control TFT 28 may be an n-type TFT.

In Embodiments 1 to 3 above, the source of the n-type TFT 27N in the inverter circuit 27 was connected to the storage capacitance wiring line 16. However, the present invention is not limited thereto, and the source of the n-type TFT 27N may be connected to a low power wiring line that is different from the storage capacitance wiring line 16 such that a low potential is applied thereto through the low power wiring line. Also, the respective gates of the input control TFT 25 and the output control TFT 28 were connected to a common input/output control wiring line 17. However, the present invention is not limited thereto, and in a manner similar to Embodiment 4 above, the gate of the input control TFT 25 may be connected to an input control wiring line 82, and the gate of the output control TFT 28 may be connected to an output control wiring line 83, respectively, such that the input control TFT 25 and the output control TFT 28 are driven and controlled by separate wiring lines 82 and 83 independently from each other.

<Manufacturing Method of TFT Substrate 1>

In Embodiments 1 to 3 above, the impurity level of each channel region 33c was adjusted by doping a p-type impurity into each semiconductor layer 33 after setting the energy level of each semiconductor layer 33 to a donor level when forming the layers. However, the present invention is not limited thereto, and the impurity level of each channel region 33c may be adjusted by doping an n-type impurity such as phosphorus (P) to each semiconductor layer 33 after setting the energy level of each semiconductor layer 33 to an acceptor level when forming the layers by changing the material, the thickness, or the like of the base films 31 and 32. In this case, the threshold voltages of the n-type TFT 27N and of other n-type TFTs 21 and 25 may be separately adjusted by doping a p-type impurity only into the semiconductor layer 33 of the n-type TFT 27N in the inverter circuit 27 in the first impurity doping process.

<Operation of Liquid Crystal Display Device S>

In Embodiment 1, after a data potential was written to the pixel potential capacitance element 22 and the pixel electrode 23 in each sub-pixel p1, the data potential was inputted into the memory circuit 24, and the refresh operation was conducted while reversing the data potential. However, the present invention is not limited thereto, and in a manner similar to Embodiment 4, the data potential may be inputted into the memory circuit 24 at the same time as it is written into the pixel potential capacitance element 22 and the pixel electrode 23 in each sub-pixel p1, and the refresh operation may be conducted while reversing the data potential.

Preferred embodiments of the present invention and modification examples thereof were described above, but the technical scope of the present invention is not limited to the embodiments and modification examples above. It shall be understood by a person skilled in the art that the above embodiments and modification examples are illustrative, that various modifications can further be made to the combinations of the respective constituting elements and respective manufacturing processes, and that those modification examples are included in the scope of the present invention.

For example, in Embodiments 1 to 4 above, the liquid crystal display device S was described as an example, but the present invention is not limited thereto. In addition to the liquid crystal display device S, the present invention can be applied to other display devices such as organic EL (electroluminescence) display devices and plasma display devices. Also, the present invention can be widely applied to electronic devices equipped with a memory circuit 24.

INDUSTRIAL APPLICABILITY

As described above, the present invention is useful for a TFT substrate, a display device equipped with the same, and a manufacturing method for a TFT substrate. More particularly, the present invention is suitable for a TFT substrate, a display device equipped with the same, and a manufacturing method for a TFT substrate in which a normal binary memory display needs to be conducted reliably by preventing erroneous operations in a control circuit that controls the refresh operation and other TFTs.

DESCRIPTION OF REFERENCE CHARACTERS

S liquid crystal display device
1 TFT substrate
17 input/output control wiring line
21 drive control TFT (second input control TFT)
22 pixel potential capacitance element (second capacitance element)
23 pixel electrode
25 input control TFT (first input control TFT)
26 memory capacitance element (first capacitance element)
27 inverter circuit (control circuit)

27N n-type TFT (operation control TFT)
27P p-type TFT (operation control TFT)
28 output control TFT
33 semiconductor layer
33d high concentration impurity region
33c channel region
34 gate insulating film
35 gate electrode
36 first interlayer insulating film
37 contact hole
38 source electrode
39 drain electrode
61 to 72 resist pattern
80N operation control n-type TFT (operation control TFT, control circuit)
80P operation control p-type TFT (operation control TFT, control circuit)

The invention claimed is:
1. A thin film transistor substrate, comprising:
a first input control thin film transistor that controls an input of a binary logic level from an exterior;
a first capacitance element that stores the binary logic level inputted through the first input control thin film transistor;
a control circuit that has at least one operation control thin film transistor that is turned on and off based on the binary logic level stored in the first capacitance element, the control circuit determining a binary logic level to be outputted to outside based on a state of the operation control thin film transistor; and
an output control thin film transistor that controls an output of the binary logic level determined by the control circuit to outside,
wherein each of the first input control thin film transistor, the output control thin film transistor, and the operation control thin film transistor is constituted of an n-type thin film transistor or a p-type thin film transistor, each of which comprises:
a semiconductor layer having a channel region between a pair of high concentration impurity regions disposed separately from each other;
a gate insulating film that covers the semiconductor layer;
a gate electrode that is disposed on the gate insulating film so as to overlap the channel region;
an interlayer insulating film that covers the gate electrode and a portion of the gate insulating film on the semiconductor layer; and
a source electrode and a drain electrode disposed on the interlayer insulating film so as to be separated from each other, the source electrode and the drain electrode being respectively connected to the different high concentration impurity regions from each other through contact holes formed in the gate insulating film and the interlayer insulating film, and
wherein at least one of said at least one operation control thin film transistor includes, in the channel region, a threshold adjustment impurity that is an impurity of a type that is a same type as that of the channel region, and a concentration of the threshold adjustment impurity is made higher than a concentration of the threshold adjustment impurity in channel regions of other thin film transistors of a same type, such that an absolute value of a threshold voltage of said at least one of said at least one operation control thin film transistor is greater than that of said other thin film transistors of the same type,
wherein the control circuit is an inverter circuit that has the n-type thin film transistor and the p-type thin film transistor each provided as the operation control thin film transistor, and an absolute value of a threshold voltage of one of the n-type thin film transistor and the p-type thin film transistor that constitutes the inverter circuit is greater than that of said other thin film transistors of the same type,
wherein said other transistors of the same type include one of said first input control thin film transistor and said output control thin film transistor, and
wherein one of the first input control thin film transistor and the output control thin film transistor is an n-type thin film transistor, and another is a p-type thin film transistor.

2. The thin film transistor substrate according to claim 1, further comprising:
a second input control thin film transistor that controls an input of an analog potential or a binary logic level from an exterior;
a pixel electrode that receives the binary logic level inputted through the second input control thin film transistor; and
a second capacitance element that stores the binary logic level inputted through the second input control thin film transistor,
wherein the first input control thin film transistor controls an input of the binary logic level inputted through the second input control thin film transistor, and
wherein the output control thin film transistor controls an output of the binary logic level determined by the control circuit to the pixel electrode and the second capacitance element.

3. The thin film transistor substrate according to claim 1, wherein gate electrodes of the respective thin film transistors are connected to a common wiring line.

4. A display device, comprising the thin film transistor substrate according to claim 1.

5. A display device comprising the thin film transistor substrate according to claim 2, wherein the display device has a first display scheme for conducting multi-gradation display in which the first input control thin film transistor is turned off, and an analog potential is inputted to the pixel electrode and the second capacitance element through the second input control thin film transistor, and a second display scheme for conducting two-gradation display that uses less power than the first display scheme, in which a binary logic level is inputted to the first capacitance element through the first input control thin film transistor and the second input control thin film transistor, and a binary logic level determined by the control circuit is inputted to the pixel electrode and the second capacitance element.

6. A manufacturing method for a thin film transistor substrate that comprises:
a first input control thin film transistor that controls an input of a binary logic level from an exterior;
a first capacitance element that stores the binary logic level inputted through the first input control thin film transistor;
a control circuit that has at least one operation control thin film transistor that is turned on and off based on the binary logic level stored in the first capacitance element, the control circuit determining a binary logic level to be outputted to outside based on a state of the operation control thin film transistor; and an output control thin film transistor that controls an output of the binary logic level determined by the control circuit to outside, wherein each of the first input control thin film transistor, the output control thin film transistor, and the operation control thin film transistor is constituted of an n-type thin film transistor or a p-type thin film transistor, each of which comprises:
- a semiconductor layer having a channel region between a pair of high concentration impurity regions disposed separately from each other;
- a gate insulating film that covers the semiconductor layer;
- a gate electrode that is disposed on the gate insulating film so as to overlap the channel region;
- an interlayer insulating film that covers the gate electrode and a portion of the gate insulating film on the semiconductor layer; and
- a source electrode and a drain electrode disposed on the interlayer insulating film so as to be separated from each other, the source electrode and the drain electrode being respectively connected to the different high concentration impurity regions from each other through contact holes formed in the gate insulating film and the interlayer insulating film, and wherein at least one of said at least one operation control thin film transistor includes, in the channel region, a threshold adjustment impurity that is an impurity of a type that is a same type as that of the channel region, and a concentration of the threshold adjustment impurity is made higher than a concentration of the threshold adjustment impurity in channel regions of other thin film transistors of a same type, such that an absolute value of a threshold voltage of said at least one of said at least one operation control thin film transistor is greater than that of said other thin film transistors of the same type, the method comprising:

conducting a semiconductor layer forming process of forming a semiconductor film on a base substrate and patterning the semiconductor film into a plurality of semiconductor layers to form the respective semiconductor layers for each thin film transistor;

conducting a gate insulating film forming process of forming a gate insulating film so as to cover the respective semiconductor layers;

conducting a first impurity doping process of doping semiconductor layers of at least one of the n-type thin film transistors and the p-type thin film transistors with a threshold adjustment impurity that is an impurity of a type that is a same type as that of the channel region of said one type of thin film transistors;

conducting, after the first impurity doping process, a gate electrode forming process of forming the respective gate electrodes on the gate insulating film so as to overlap regions of the respective semiconductor layers where channel regions are to be formed;

conducting a second impurity doping process of doping an n-type impurity to semiconductor layers of the n-type thin film transistors and a p-type impurity to semiconductor layers of the p-type thin film transistors, respectively, out of the plurality of semiconductor layers, using the respective gate electrodes as masks, to form the pair of high concentration impurity regions and a channel region in each of the semiconductor layers;

conducting, after the second impurity doping process, an interlayer insulating film forming process of forming the interlayer insulating film so as to cover the respective gate electrodes and the gate insulating film;

conducting a contact hole forming process of patterning the interlayer insulating film and the gate insulating film to form the respective contact holes in the two insulating films so as to respectively reach the pair of high concentration impurity regions of each of the semiconductor layers; and conducting a source/drain electrode forming process of forming a conductive film on the interlayer insulating film having the contact holes formed therein and patterning the conductive film, to form the respective source electrodes and the respective drain electrodes, wherein, in the first impurity doping process, the threshold adjustment impurity is doped to a semiconductor layer of at least one of said at least one operation control thin film transistor with a greater amount than that in semiconductor layers of other thin film transistors of a same type, or the threshold adjustment impurity is doped only into a semiconductor layer of at least one of said at least one operation control thin film transistor, wherein the first impurity doping process comprises:
- a same type layer doping step of forming a resist pattern for same type layer doping on the gate insulating film in regions overlapping semiconductor layers of one of the n-type thin film transistors and the p-type thin film transistors, out of the plurality of semiconductor layers, and doping the threshold adjustment impurity into semiconductor layers of another of the n-type thin film transistors and the p-type thin film transistors using the resist pattern for same type layer doping as a mask; and
- an adjustment doping step of forming a resist pattern for adjustment doping on the gate insulating film in regions overlapping semiconductor layers except for a specific semiconductor layer of at least one of said at least one operation control thin film transistor, out of the plurality of semiconductor layers, and doping the threshold adjustment impurity into the specific semiconductor layer using the resist pattern for adjustment doping as a mask, wherein, in the same type layer doping step and the adjustment doping step, the threshold adjustment impurity is doped into semiconductor layers of thin film transistors of a same type, wherein, in the adjustment doping step, the resist pattern for adjustment doping is formed by using a multi-tone mask such that regions thereof that overlap semiconductor layers of thin film transistors of a different type from that of the operation control thin film transistor having the specific semiconductor layer are made thicker than other portions, and wherein, in the same type layer doping step, the resist pattern for same type layer doping is formed by thinning the resist pattern for adjustment doping such that the resist pattern is left only in regions that overlap semiconductor layers of thin film transistors of a different type from that of the operation control thin film transistor having the specific semiconductor layer.

7. A manufacturing method for a thin film transistor substrate that comprises:
- a first input control thin film transistor that controls an input of a binary logic level from an exterior;
- a first capacitance element that stores the binary logic level inputted through the first input control thin film transistor;

a control circuit that has at least one operation control thin film transistor that is turned on and off based on the binary logic level stored in the first capacitance element, the control circuit determining a binary logic level to be outputted to outside based on a state of the operation control thin film transistor; and an output control thin film transistor that controls an output of the binary logic level determined by the control circuit to outside, wherein each of the first input control thin film transistor, the output control thin film transistor, and the operation control thin film transistor is constituted of an n-type thin film transistor or a p-type thin film transistor, each of which comprises:

a semiconductor layer having a channel region between a pair of high concentration impurity regions disposed separately from each other;

a gate insulating film that covers the semiconductor layer;

a gate electrode that is disposed on the gate insulating film so as to overlap the channel region;

an interlayer insulating film that covers the gate electrode and a portion of the gate insulating film on the semiconductor layer; and a source electrode and a drain electrode disposed on the interlayer insulating film so as to be separated from each other, the source electrode and the drain electrode being respectively connected to the high concentration impurity regions different from each other through contact holes formed in the gate insulating film and the interlayer insulating film, and wherein at least one of said at least one operation control thin film transistor includes, in the channel region, a threshold adjustment impurity that is an impurity of a type that is opposite to the type of the channel region, and a concentration of the threshold adjustment impurity is made lower than a concentration of the threshold adjustment impurity in channel regions of other thin film transistors of a same type, such that an absolute value of a threshold voltage of said at least one of said at least one operation control thin film transistor is greater than that of said other thin film transistors of the same type, the method comprising:

conducting a semiconductor layer forming process of forming a semiconductor film on a base substrate and patterning the semiconductor film into a plurality of semiconductor layers to form the respective semiconductor layers for each thin film transistor;

conducting a gate insulating film forming process of forming a gate insulating film so as to cover the respective semiconductor layers;

conducting a first impurity doping process of doping semiconductor layers of the n-type thin film transistors or the p-type thin film transistors with a threshold adjustment impurity that is an impurity of a type that is opposite to the type of the channel regions of said thin film transistors;

conducting, after the first impurity doping process, a gate electrode forming process of forming the respective gate electrodes on the gate insulating film so as to overlap the respective semiconductor layers;

conducting a second impurity doping process of doping an n-type impurity to semiconductor layers of the n-type thin film transistors and a p-type impurity to semiconductor layers of the p-type thin film transistors, respectively, out of the plurality of semiconductor layers, using the respective gate electrodes as masks, to form the pair of high concentration impurity regions and a channel region in each of said semiconductor layers;

conducting, after the second impurity doping process, an interlayer insulating film forming process of forming the interlayer insulating film so as to cover the respective gate electrodes and the gate insulating film;

conducting a contact hole forming process of patterning the interlayer insulating film and the gate insulating film to form the respective contact holes in the two insulating films so as to respectively reach the pair of high concentration impurity regions of each of the semiconductor layers; and conducting a source/drain electrode forming process of forming a conductive film on the interlayer insulating film having the contact holes formed therein and patterning the conductive film, to form the respective source electrodes and the respective drain electrodes, wherein, in the first impurity doping process, the threshold adjustment impurity is doped to a semiconductor layer of at least one of said at least one operation control thin film transistor with a smaller amount than that in semiconductor layers of other thin film transistor of a same type, or the threshold adjustment impurity is not doped to said semiconductor layer at all, wherein the first impurity doping process comprises:

an adjustment doping step of forming a resist pattern for adjustment doping on the gate insulating film in a region overlapping a specific semiconductor layer of at least one of said at least one operation control thin film transistor, out of the plurality of semiconductor layers, and doping the threshold adjustment impurity into semiconductor layers except for the specific semiconductor layer using the resist pattern for adjustment doping as a mask; and a same type layer doping step of forming a resist pattern for same type layer doping on the gate insulating film in regions overlapping semiconductor layers of one of the n-type thin film transistors and the p-type thin film transistors, out of the plurality of semiconductor layers, and doping the threshold adjustment impurity into semiconductor layers of another of the n-type thin film transistors and the p-type thin film transistors using the resist pattern for same type layer doping as a mask, wherein, in the same type layer doping step and the adjustment doping step, the threshold adjustment impurity is not doped into semiconductor layers of thin film transistors of a same type, wherein, in the same type layer doping step, the resist pattern for same type layer doping is formed by using a multi-tone mask such that a portion thereof overlapping the specific semiconductor layer is made thicker than other portions, and wherein, in the adjustment doping step, the resist pattern for adjustment doping is formed by thinning the resist pattern for same type layer doping such that the resist pattern is left only in a region that overlaps the specific semiconductor layer.

* * * * *